(12) United States Patent
Burroughs et al.

(10) Patent No.: US 11,125,862 B2
(45) Date of Patent: Sep. 21, 2021

(54) EMITTER STRUCTURES FOR ULTRA-SMALL VERTICAL CAVITY SURFACE EMITTING LASERS (VCSELS) AND ARRAYS INCORPORATING THE SAME

(71) Applicant: Sense Photonics, Inc., Durham, NC (US)

(72) Inventors: Scott Burroughs, Raleigh, NC (US); Brent Fisher, Bethesda, MD (US); James Carter, Chapel Hill, NC (US)

(73) Assignee: Sense Photonics, Inc., Durham, NC (US)

( * ) Notice: Subject to any disclaimer, the term of this patent is extended or adjusted under 35 U.S.C. 154(b) by 121 days.

(21) Appl. No.: 16/693,666

(22) Filed: Nov. 25, 2019

(65) Prior Publication Data

US 2020/0161835 A1 May 21, 2020

Related U.S. Application Data

(63) Continuation of application No. 15/951,727, filed on Apr. 12, 2018, now Pat. No. 10,530,130.

(Continued)

(51) Int. Cl.
*H01S 5/183* (2006.01)
*H01S 5/30* (2006.01)
(Continued)

(52) U.S. Cl.
CPC .......... *G01S 7/4815* (2013.01); *F21V 5/041* (2013.01); *F21V 5/045* (2013.01); *G01J 1/44* (2013.01);

(Continued)

(58) Field of Classification Search
CPC .......... H01S 5/18397; H01S 5/04254; H01S 5/18394; H01S 5/30; H01S 5/0028;
(Continued)

(56) References Cited

U.S. PATENT DOCUMENTS 6,246,708 B1  6/2001  Thornton et al.
6,262,540 B1  7/2001  Seko
(Continued)

FOREIGN PATENT DOCUMENTS

CN  1469472 A  1/2004
CN  1650489 A  8/2005
(Continued)

OTHER PUBLICATIONS

Extended European Search Report corresponding to European Application No. 18784778.5 (12 pages) (dated Jan. 12, 2021).
(Continued)

*Primary Examiner* — Tuan N Nguyen
(74) *Attorney, Agent, or Firm* — Myers Bigel, P.A.

(57) ABSTRACT

A laser diode includes a semiconductor structure of a lower Bragg reflector layer, an active region, and an upper Bragg reflector layer. The upper Bragg reflector layer includes a lasing aperture having an optical axis oriented perpendicular to a surface of the active region. The active region includes a first material, and the lower Bragg reflector layer includes a second material, where respective lattice structures of the first and second materials are independent of one another. Related laser arrays and methods of fabrication are also discussed.

20 Claims, 20 Drawing Sheets

Related U.S. Application Data

(60) Provisional application No. 62/484,701, filed on Apr. 12, 2017, provisional application No. 62/613,985, filed on Jan. 5, 2018.

(51) Int. Cl.

| | |
|---|---|
| *H01S 5/00* | (2006.01) |
| *G01S 17/02* | (2020.01) |
| *G01S 17/89* | (2020.01) |
| *H01S 5/042* | (2006.01) |
| *H01S 5/40* | (2006.01) |
| *G02B 26/10* | (2006.01) |
| *H01S 5/42* | (2006.01) |
| *H01L 31/167* | (2006.01) |
| *G02B 5/08* | (2006.01) |
| *H01L 25/00* | (2006.01) |
| *H01S 3/02* | (2006.01) |
| *G01S 7/481* | (2006.01) |
| *H01S 5/026* | (2006.01) |
| *H01S 5/02253* | (2021.01) |
| *F21V 5/04* | (2006.01) |
| *H01S 5/062* | (2006.01) |
| *G01J 1/44* | (2006.01) |
| *H01L 31/18* | (2006.01) |
| *G02B 3/00* | (2006.01) |
| *H01S 5/12* | (2021.01) |
| *H01S 5/02* | (2006.01) |
| *H01S 5/02255* | (2021.01) |

(52) U.S. Cl.
CPC .............. *G01S 17/02* (2013.01); *G01S 17/89* (2013.01); *G02B 5/0883* (2013.01); *G02B 26/10* (2013.01); *H01L 25/50* (2013.01); *H01L 31/167* (2013.01); *H01L 31/18* (2013.01); *H01S 3/025* (2013.01); *H01S 5/0028* (2013.01); *H01S 5/0071* (2013.01); *H01S 5/026* (2013.01); *H01S 5/0262* (2013.01); *H01S 5/02253* (2021.01); *H01S 5/04254* (2019.08); *H01S 5/062* (2013.01); *H01S 5/183* (2013.01); *H01S 5/18394* (2013.01); *H01S 5/18397* (2013.01); *H01S 5/30* (2013.01); *H01S 5/40* (2013.01); *H01S 5/4025* (2013.01); *H01S 5/4037* (2013.01); *H01S 5/4075* (2013.01); *H01S 5/423* (2013.01); *G01J 2001/448* (2013.01); *G02B 3/0006* (2013.01); *H01S 5/0216* (2013.01); *H01S 5/0217* (2013.01); *H01S 5/02255* (2021.01); *H01S 5/04257* (2019.08); *H01S 5/12* (2013.01)

(58) Field of Classification Search
CPC ..... H01S 3/02; H01S 5/00; H01S 5/40; H01S 5/0262; F21V 5/045; F21V 5/041; G01S 7/4815; G01S 17/02
See application file for complete search history.

(56) References Cited

U.S. PATENT DOCUMENTS

| | | | |
|---|---|---|---|
| 6,277,696 B1 * | 8/2001 | Carey | .................. H01S 5/1838 438/246 |
| 6,280,523 B1 | 8/2001 | Coman et al. | |
| 6,341,137 B1 | 1/2002 | Jayaraman et al. | |
| 7,544,945 B2 | 6/2009 | Tan et al. | |
| 8,761,594 B1 | 6/2014 | Gross et al. | |
| 8,865,489 B2 | 10/2014 | Rogers et al. | |
| 9,065,239 B2 | 6/2015 | Joseph et al. | |
| 9,484,495 B2 | 11/2016 | Padullaparthi | |
| 2001/0011730 A1 | 8/2001 | Saeki | |
| 2001/0046249 A1 | 11/2001 | Streubel | |
| 2003/0185268 A1 | 10/2003 | Zhang | |
| 2004/0036074 A1 * | 2/2004 | Kondo | ................... H01L 24/82 257/79 |
| 2010/0046953 A1 | 2/2010 | Shaw et al. | |
| 2010/0051900 A1 | 3/2010 | Huffaker et al. | |
| 2010/0195689 A1 | 8/2010 | Ariga et al. | |
| 2012/0033692 A1 | 2/2012 | Schleuning et al. | |
| 2014/0218898 A1 | 8/2014 | Seurin et al. | |
| 2015/0115299 A1 | 4/2015 | Grundmann et al. | |
| 2015/0219764 A1 * | 8/2015 | Lipson | .................... G01S 17/89 356/4.01 |
| 2015/0309254 A1 * | 10/2015 | Bowers | ................. H01S 5/0208 385/2 |
| 2016/0020582 A1 | 1/2016 | Ma et al. | |
| 2016/0141839 A1 | 5/2016 | Matsubara et al. | |
| 2016/0282468 A1 | 9/2016 | Gruver et al. | |
| 2017/0063035 A1 | 3/2017 | Wang et al. | |
| 2017/0070027 A1 | 3/2017 | Kondo et al. | |

FOREIGN PATENT DOCUMENTS

| | | |
|---|---|---|
| CN | 103180973 A | 6/2013 |
| CN | 105552715 A | 5/2016 |
| CN | 106505410 A | 3/2017 |
| JP | 2005-158922 A | 6/2005 |
| JP | 2005-285831 A | 10/2005 |
| JP | 2005322857 A | 11/2005 |
| KR | 10-2003-0038072 A | 5/2003 |
| KR | 10-2012-0131821 A | 12/2012 |

OTHER PUBLICATIONS

Geske et al. "Long-Wavelength Two-Dimensional WDM Vertical Cavity Surface-Emitting Laser Arrays Fabricated by Nonplanar Wafer Bonding" IEEE Photonics Technology Letters 15(2):179-181 (Feb. 2003).
Chinese Office Action Corresponding to Chinese Patent Application No. 201880034124.8 (Foreign Text, 11 Pages, English Translation Thereof, 9 Pages) (dated Aug. 25, 2020).
Chinese Office Action Corresponding to Chinese Patent Application No. 201880034124.8 (Foreign Text, 14 Pages, English Translation Thereof, 9 Pages) (dated Apr. 19, 2021).
Kang et al. "Compliant, Heterogeneously Integrated GaAs Micro-VCSELS towards Wearable and Implantable Integrated Optoelectronics Platforms" Advanced Optical Materials (33 pages) (2014).
Kim et al. "GaN microcavity structure with dielectric distributed Bragg reflectors fabricated by using a wet-chemical etching of a (111) Si substrate" Applied Physics Letters 89(4):041129 (2006).
Liu, Yue "Heterogeneous Integration of OE Arrays With Si Electronics and Microoptics" IEEE Transactions on Advanced Packaging 25(1):43-49 (2002).
Muller et al. "1550-nm High-Speed Short-Cavity VCSELs" IEEE Journal of Selected Topics in Quantum Electronics 17(5):1158-1166 (2011).
Notification of Transmittal of the International Search Report and the Written Opinion of the International Searching Authority, or the Declaration, in corresponding PCT Application No. PCT/US2018/027292 (14 pages) (dated Aug. 6, 2018).

* cited by examiner

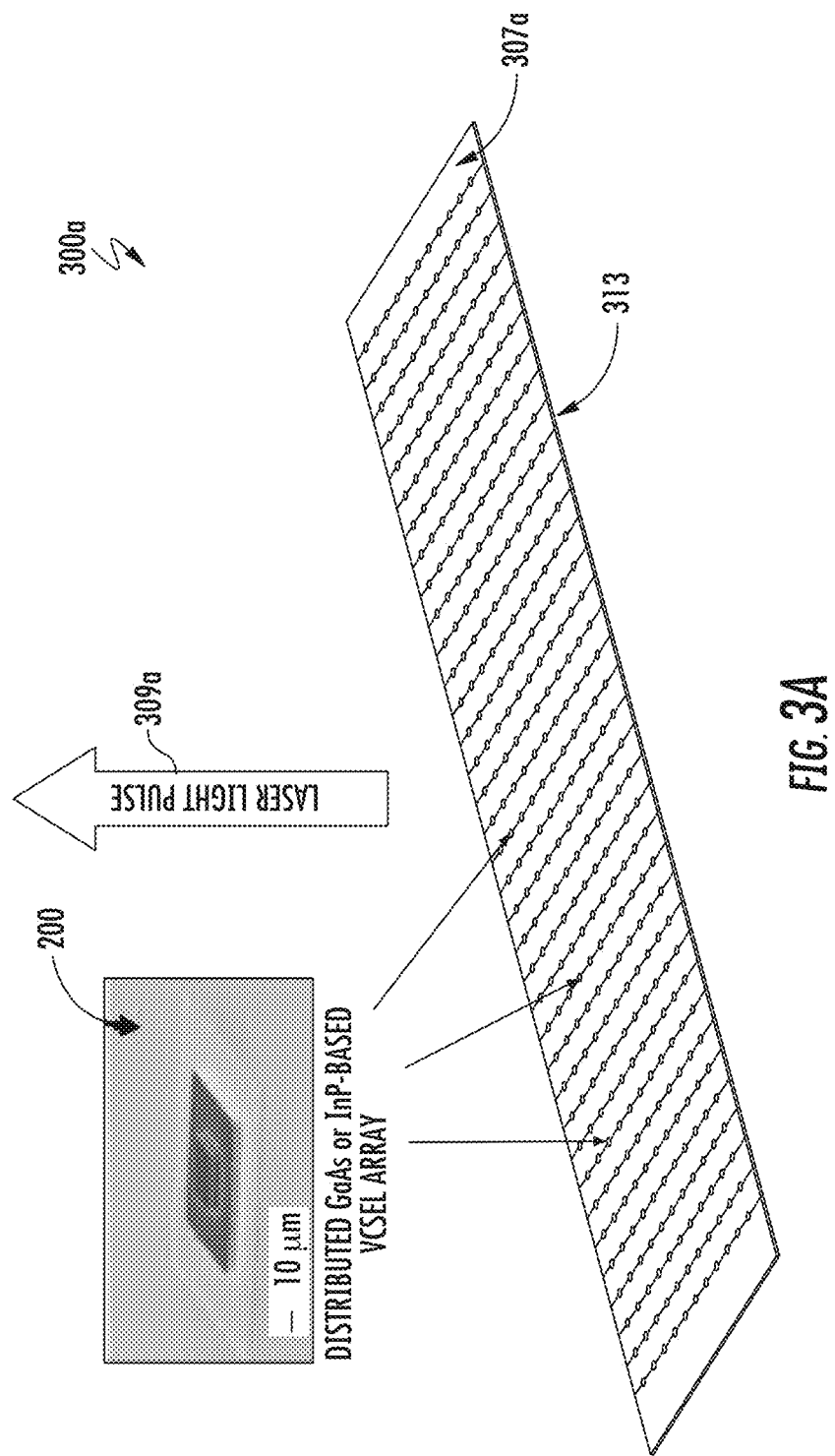

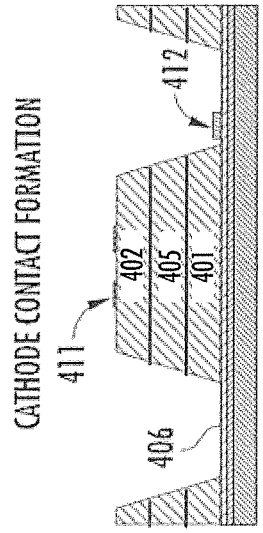
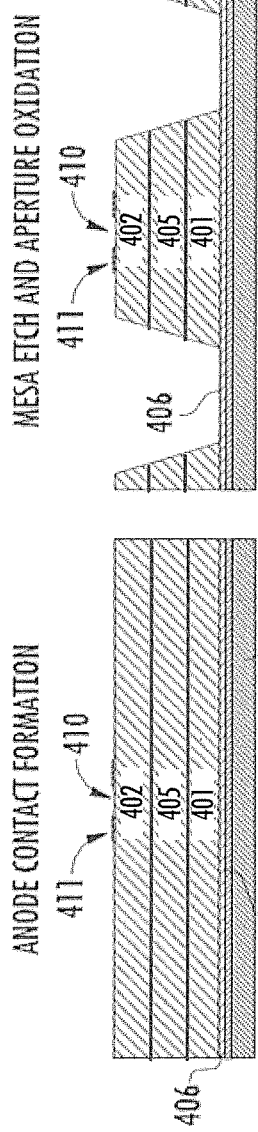
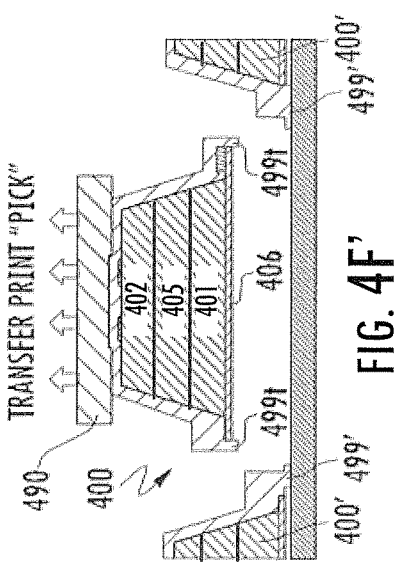
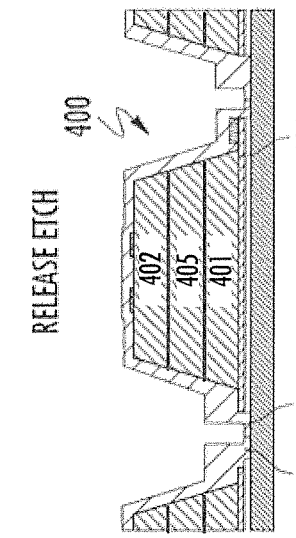
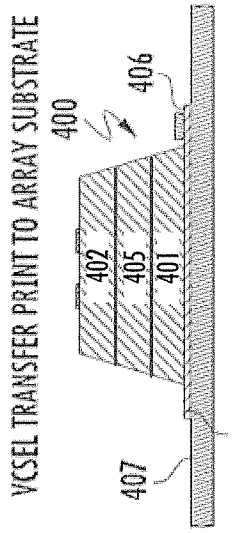
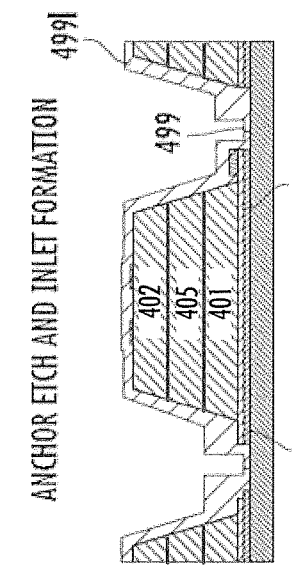

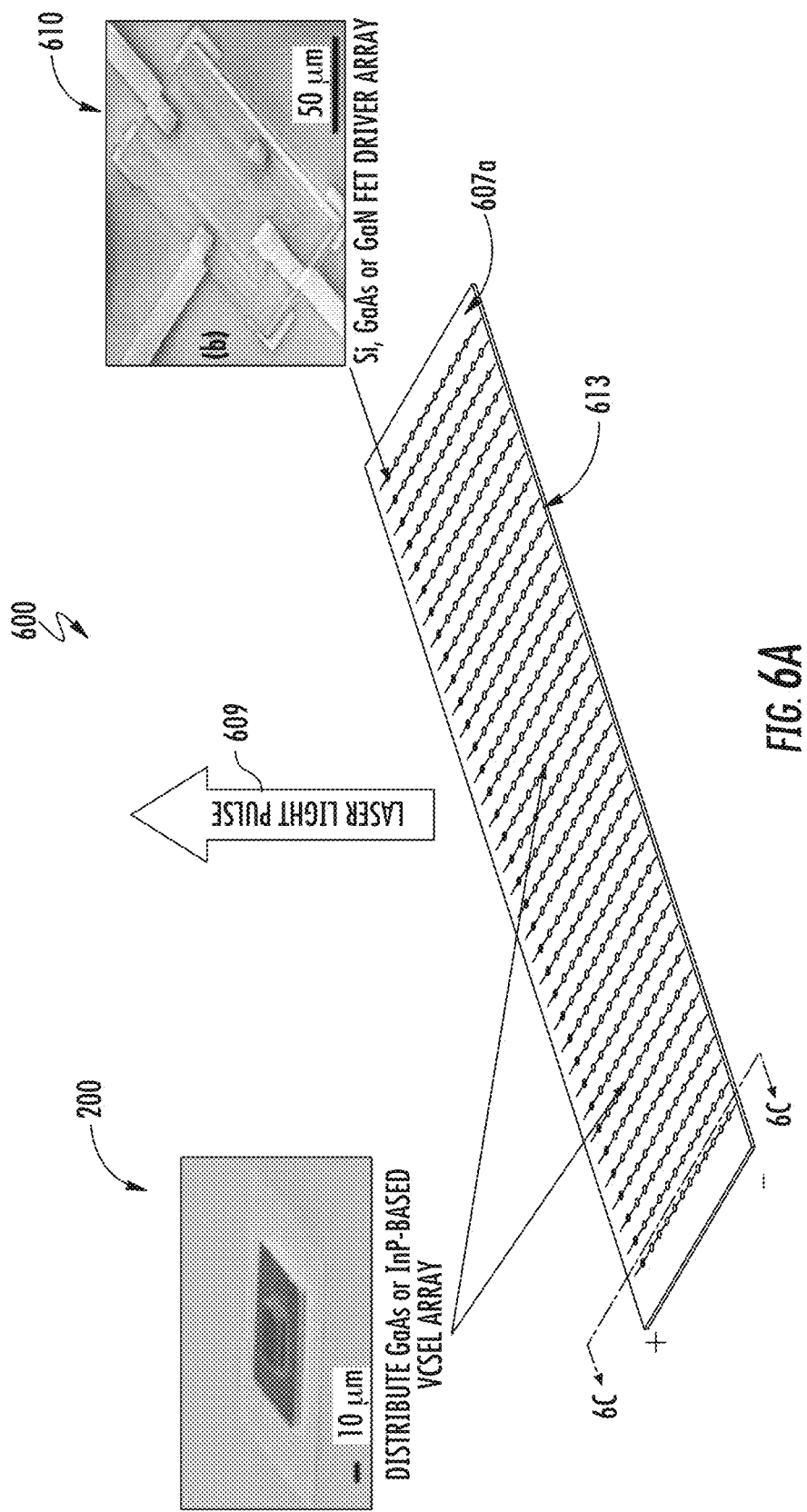

EMITTER STRUCTURES FOR ULTRA-SMALL VERTICAL CAVITY SURFACE EMITTING LASERS (VCSELS) AND ARRAYS INCORPORATING THE SAME

CLAIM OF PRIORITY

This application is a continuation application of and claims priority from U.S. patent application Ser. No. 15/951,727 filed Apr. 12, 2018, which claims priority from U.S. Provisional Patent Application No. 62/484,701 entitled "LIGHT DETECTION AND RANGING (LIDAR) DEVICES AND METHODS OF FABRICATING THE SAME" filed Apr. 12, 2017, and U.S. Provisional Patent Application No. 62/613,985 entitled "ULTRA-SMALL VERTICAL CAVITY SURFACE EMITTING LASER (VCSEL) AND ARRAYS INCORPORATING THE SAME" filed Jan. 5, 2018, with the United States Patent and Trademark Office, the disclosures of which are incorporated by reference herein.

FIELD

The present invention relates to semiconductor-based lasers and related devices and methods of operation.

BACKGROUND

Many emerging technologies, such as Internet-of-Things (IoT) and autonomous navigation, may involve detection and measurement of distance to objects in three-dimensional (3D) space. For example, automobiles that are capable of autonomous driving may require 3D detection and recognition for basic operation, as well as to meet safety requirements. 3D detection and recognition may also be needed for indoor navigation, for example, by industrial or household robots or toys.

Light based 3D measurements may be superior to radar (low angular accuracy, bulky) or ultra-sound (very low accuracy) in some instances. For example, a light-based 3D sensor system may include a detector (such as a photodiode or camera) and a light emitting device (such as a light emitting diode (LED) or laser diode) as light source, which typically emits light outside of the visible wavelength range. A vertical cavity surface emitting laser (VCSEL) is one type of light emitting device that may be used in light-based sensors for measurement of distance and velocity in 3D space. Arrays of VCSELs may allow for power scaling and can provide very short pulses at higher power density.

SUMMARY

Some embodiments described herein are directed to a laser diode, such as a VCSEL or other surface-emitting laser diode or edge-emitting laser diode or other semiconductor laser, and arrays incorporating the same.

In some embodiments, the laser diode may be a surface-emitting laser diode. The laser diode includes a semiconductor structure comprising an n-type layer, an active region (which may comprise at least one quantum well layer), and a p-type layer. One of the n-type and p-type layers comprises a lasing aperture thereon having an optical axis oriented perpendicular to a surface of the active region between the n-type and p-type layers. The laser diode further includes first and second contacts electrically connected to the n-type and p-type layers, respectively. The first and/or second contacts are smaller than the lasing aperture in at least one dimension.

In some embodiments, the laser diode may be an edge-emitting laser diode. The laser diode includes an n-type layer, an active region, a p-type layer, and first and second contacts electrically connected to the n-type and p-type layers, respectively. A lasing aperture has an optical axis oriented parallel to a surface of the active region between the n-type and p-type layers. The laser diode further includes first and second contacts electrically connected to the n-type and p-type layers, respectively. The first and/or second contacts may be smaller than the lasing aperture in at least one dimension.

According to some embodiments described herein, a laser diode includes a semiconductor structure having a lower Bragg reflector layer, an active region, and an upper Bragg reflector layer. The upper Bragg reflector layer comprises a lasing aperture thereon having an optical axis oriented perpendicular to a surface of the active region. The active region comprises a first material, and the lower Bragg reflector layer comprises a second material, where respective lattice structures of the first and second materials are independent of one another. A bandgap of the second material of the lower Bragg reflector may be lower than a bandgap of the first material of the active region.

In some embodiments, the respective lattice structures of the first and second materials may be lattice mismatched.

In some embodiments, the second material of the lower Bragg reflector layer may be a dielectric material. In some embodiments, the upper Bragg reflector layer may also include a dielectric material, and may have a lower reflectivity than the lower Bragg reflector layer at a desired wavelength of operation.

In some embodiments, an interface between the lower Bragg reflector layer and the active region may be free of a seed layer for the first material. In some embodiments, an interface between the lower Bragg reflector layer and the active region may include an adhesive layer. In some embodiments, first and/or second contacts to the active region may be smaller than the lasing aperture in at least one dimension.

In some embodiments, at least one of the lower Bragg reflector layer, the active region, or the upper Bragg reflector layer may be a micro-transfer-printed layer having a residual tether portion and/or a relief feature at a periphery thereof. In some embodiments, at least one of the residual tether portion or the relief feature may include the first material.

In some embodiments, the first material may be configured to emit light comprising a wavelength of about 1400 nanometers to about 1600 nanometers. For example, the first material may be an indium phosphide (InP)-based layer.

In some embodiments, the laser diode may be a first laser diode of a plurality of laser diodes arranged in an array on a surface of a non-native substrate. In some embodiments, a spacing between the first laser diode and an immediately adjacent laser diode of the plurality of laser diodes may be less than about 500 micrometers, less than about 200 micrometers, less than about 150 micrometers, less than about 100 micrometers, or less than about 50 micrometers, but may be greater than about 30 micrometers, greater than about 20 micrometers, or greater than about 10 micrometers.

In some embodiments, the array may be on a back surface of the non-native substrate, and the laser diodes may be arranged to emit light through the non-native substrate. The non-native substrate may include a material that is transparent to and is configured to at least partially collimate the light. In some embodiments, at least one lens element may be on a front surface of the non-native substrate, such that the non-native substrate is between the at least one lens element and the laser diodes.

In some embodiments, the plurality of laser diodes may further include a second laser diode comprising a second active region of a third material between second upper and lower Bragg reflector layers. Respective lattice structures of the third material and of the second lower Bragg reflector layer are independent of one another. This second laser diode may operate at a different wavelength than the first laser diode, or may operate at the same wavelength, but with some other difference in performance.

In some embodiments, the third material may be configured to emit light comprising a wavelength of about 350 nanometers to about 450 nanometers. For example, the third material may be a gallium nitride (GaN)-based layer.

In some embodiments, the first and second laser diodes may be interspersed in the array among the plurality of laser diodes. In some embodiments, the array may include a first area including a plurality of the first laser diodes and being free of the second laser diodes, and a second area including a plurality of the second laser diodes and being free of the first laser diodes.

In some embodiments, the laser diode may be a first laser diode that is free of electrical contacts thereto, and may further include a second laser diode comprising a second active region of a third material that is configured to emit light comprising a shorter emission wavelength than that of the first material. The second laser diode may be arranged to optically pump the active region of the first laser diode with the light comprising the shorter emission wavelength.

In some embodiments, the second laser diode may include the second active region between second upper and lower Bragg reflector layers that comprise the third material. Respective lattice structures of the third material, the second material, and the first material may be independent of one another. An optical axis of a lasing aperture of the second laser diode may be oriented perpendicular to a surface of the second active region. In some embodiments, the lower Bragg reflector layer of the first laser diode may be stacked directly on the second upper Bragg reflector layer of the second laser diode.

In some embodiments, an optical axis of a lasing aperture of the second laser diode may be oriented parallel to a surface of the second active region. A mirror structure may be arranged relative to the lasing aperture to reflect the light comprising the shorter emission wavelength toward the active region of the first laser diode.

In some embodiments, a method of fabricating a laser diode, such as a VCSEL or other surface-emitting or edge-emitting laser diode, is provided. The method may include fabricating an array of laser diodes (also referred to herein as a laser diode array or laser array), for example, using micro-transfer printing, electrostatic adhesion, and/or other mass transfer techniques.

According to some embodiments, a method of fabricating a laser array includes providing a plurality of laser diodes on a non-native substrate. Each of the laser diodes comprises a semiconductor structure having a lower Bragg reflector layer, an active region, and an upper Bragg reflector layer. The upper Bragg reflector layer includes a lasing aperture thereon having an optical axis oriented perpendicular to a surface of the active region. The active region comprises a first material, and the lower Bragg reflector layer comprises a second material, where respective lattice structures of the first and second materials are independent of one another.

In some embodiments, the second material may be a dielectric material. Providing each of the laser diodes on the non-native substrate may include forming the lower Bragg reflector layer on the non-native substrate using a thin film deposition or micro transfer-printing process, providing the active region on a surface of the lower Bragg reflector layer such that an interface therebetween is free of a seed layer for the first material (for example, using the micro transfer-printing process), and forming the upper Bragg reflector layer on a surface of the active region using the thin film deposition or micro transfer-printing process.

In some embodiments, an array of discrete laser diodes (also referred to herein as a laser diode array or laser array) is provided. The array of laser diodes may include surface-emitting laser diodes and/or edge-emitting laser diodes electrically connected in series and/or parallel by thin-film interconnects on non-native rigid and/or flexible substrates. The array of laser diodes may further include one or more driver transistors and/or devices of other types/materials (e.g. power capacitors, etc.) integrated in the array.

According to some embodiments, a laser array includes a plurality of discrete laser diodes arranged on a non-native substrate. Each of the laser diodes comprises a semiconductor structure having a lower Bragg reflector layer, an active region, and an upper Bragg reflector layer. The upper Bragg reflector layer includes a lasing aperture thereon having an optical axis oriented perpendicular to a surface of the active region. The active region comprises a first material, and the lower Bragg reflector layer comprises a second material, where respective lattice structures of the first and second materials are independent of one another.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 3A is a perspective view illustrating a distributed emitter array including laser diodes in accordance with some embodiments described herein.

FIGS. 4A'-4G' are cross-sectional views illustrating an example fabrication process for laser diodes in accordance with some embodiments described herein.

FIG. 6A is a perspective view illustrating an example emitter array including heterogeneous integration of distributed laser diodes and distributed driver transistors in accordance with some embodiments described herein.

DETAILED DESCRIPTION

Figure 1:
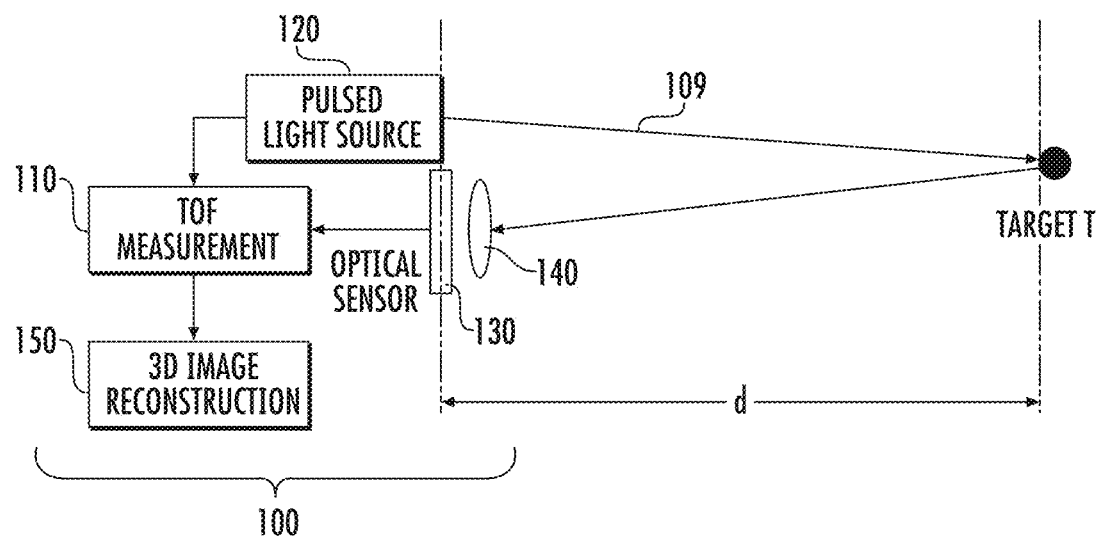
FIG. 1 is a diagram illustrating an example light-based 3D sensor system in accordance with some embodiments described herein.

Embodiments described herein may arise from realization that more compact arrays of light emitters may be advantageous in emerging technologies. For example, as shown in FIG. 1, a light-based 3D sensor system 100, such as a Light Detection and Ranging (LIDAR) system, may use time-of-flight (TOF)-based measurement circuit 110 and a 3D image reconstruction circuit 150 based on a signal received from an optical detector circuit 130 and associated optics 140, with a pulsed light emitting device array 120 as a light source. The time-of-flight measurement circuit 110 may determine the distance d to target T by measuring the round trip ("time-of-flight"; ToF) of a laser pulse 109 reflected by the target T (where d=(speed of light (c)/2)×ToF), which may be used by the 3D image reconstruction circuit 150 to create an accurate 3D map of surroundings. Some advantages of LIDAR systems may include long range; high accuracy; superior object detection and recognition; higher resolution; higher sampling density of 3D point cloud; and effectivity in diverse lighting and/or weather conditions. Applications of LIDAR systems may include ADAS (Advanced Driver Assistance Systems), autonomous vehicles, UAVs (unmanned aerial vehicles), industrial automation, robotics, biometrics, modeling, augmented and virtual reality, 3D mapping, and security. The example of FIG. 1 illustrates a flash LIDAR system, where the pulsed light emitting device array 120 emits light for short durations over a relatively large area to acquire images, in contrast with some traditional scanning LIDAR techniques (which generate image frames by raster scanning). However, it will be understood that light emitting device arrays 120 described herein can be used for implementations of scanning LIDAR as well.

Still referring to FIG. 1, the light emitting device array 120 may include a plurality of electrically connected surface-emitting laser diodes, such as VCSELs, and may be operated with strong single pulses at low duty cycle or with pulse trains, typically at wavelengths outside of the visible spectrum. Because of sensitivity to background light and the decrease of the signal with distance, several watts of laser power may be used to detect a target T at a distance d of up to about 100 meters or more.

However, some conventional VCSELs may have sizes defined by dimensions (e.g., length, width, and/or diameter) of about 150 micrometers (μm) to about 200 μm, which may impose size and/or density constraints on sensor systems including an array of VCSELs. This relatively large VCSEL size may be dictated for use with conventional pick-and-place machines, as well as for sufficient contact surface area for wire bond pads to provide electrical connections to the VCSEL. For example, some conventional solder ball or wire bond technology may require more than about 30 μm in length for the bond pad alone, while the tip used to pull the wire bond may have an accuracy on the order of tens of micrometers.

Some embodiments described herein provide light emitting devices, such as surface-emitting laser diodes (e.g., VCSELs), having reduced dimensions (e.g., lengths and/or widths of about 30 micrometers (μm) or less) without affecting the device performance (e.g., power output). For example, the aperture of the VCSEL die (which is the active region where the lasing takes place) may be about 10 μm to about 20 μm in diameter. The die length can be reduced to the aperture diameter plus a few microns by reducing or eliminating wasted (non-active) area, and by retaining a few microns (e.g., about 4 μm to about 6 μm or less) of combined chip length for the anode and the cathode contacts. This may provide a reduction in dimensions (e.g., length and/or width) by a factor of about 10 or more (e.g., die lengths of about 15 micrometers (μm) to about 20 μm, as compared to some conventional VCELs with die lengths of about 150 μm to about 200 μm). In some embodiments, these reduced die dimensions may allow for fabrication of emitter arrays including a greater density (e.g., thousands) of VCSELs or other laser diodes.

Figure 2A:
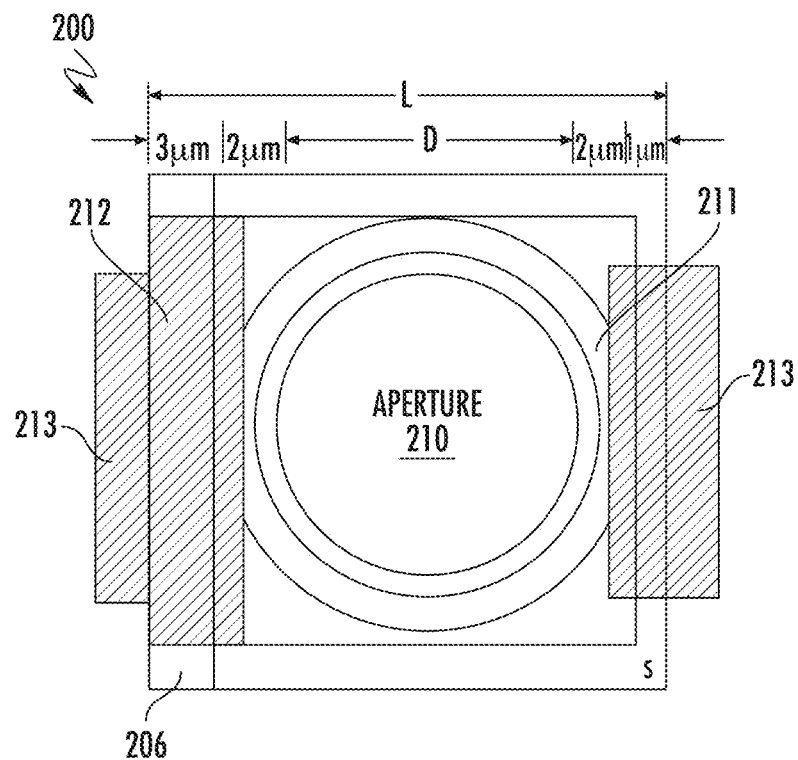
FIG. 2A is a plan view illustrating an example laser diode with reduced anode and cathode contact dimensions in accordance with some embodiments described herein.
Figure 2B:
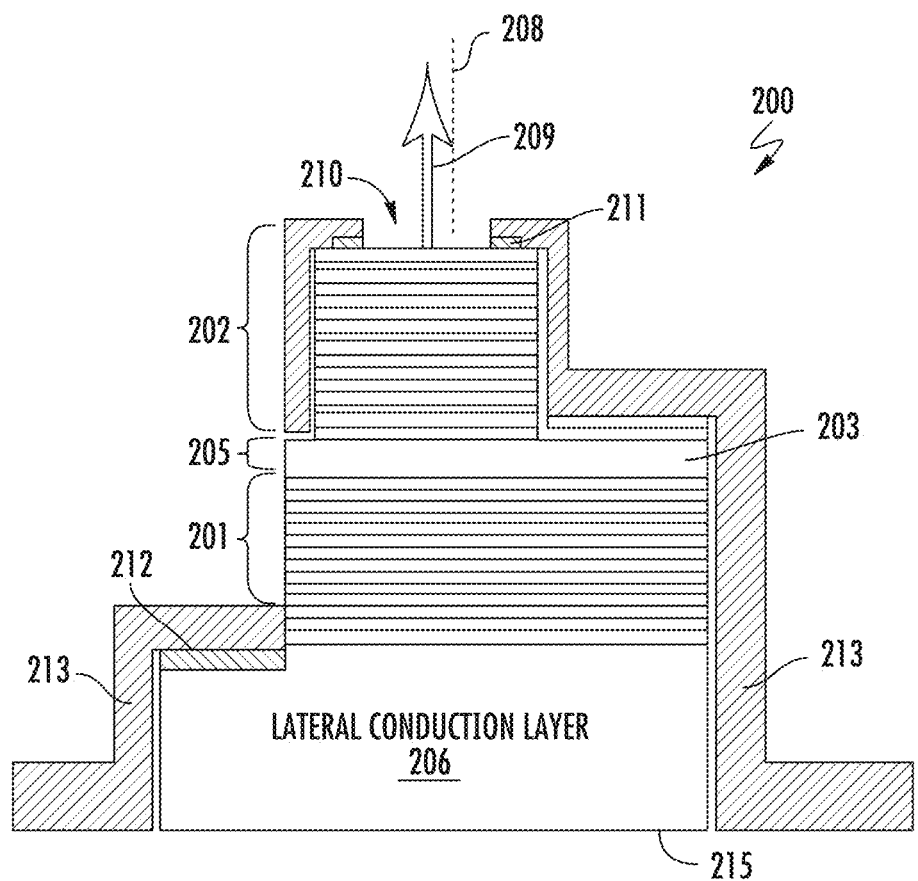
FIG. 2B is a cross-sectional view of the laser diode of FIG. 2A.

FIGS. 2A and 2B are plan and cross-sectional views illustrating an example surface-emitting light emitting device (shown as a vertical cavity surface emitting laser diode (VCSEL) chip or die 200, also referred to herein as a VCSEL 200) in accordance with some embodiments described herein, which includes anode and cathode contacts 211, 212 that are smaller than the lasing aperture 210 in at least one dimension. As shown in FIGS. 2A and 2B, the VCSEL 200 includes an active region 205 with one or more quantum wells 203 for generation and emission of coherent light 209. The optical cavity axis 208 of the VCSEL 200 is oriented along the direction of current flow (rather than perpendicular to the current flow as in some conventional laser diodes), defining a vertical cavity with a length along the direction of current flow. This cavity length of the active region 205 may be short compared with the lateral dimensions of the active region 205, so that the radiation 209 emerges from the surface of the cavity rather than from its edge.

The active region 205 may be sandwiched between distributed Bragg reflector (DBR) layers (also referred to herein as Bragg reflector layers or Bragg mirrors) 201 and 202 provided on a lateral conduction layer (LCL) 206. The LCL 206 may allow for improved electrical and/or optical characteristics (as compared to direct contact to the reflector layer 401) in some embodiments. In some embodiments, a surface of the LCL layer 206 may provide a print interface 215 including an adhesive layer that improves adhesion with an underlying layer or substrate. The adhesive layer may be optically transparent to one or more wavelength ranges and/or can be refractive-index matched to provide desired optical performance. The reflector layers 201 and 202 at the ends of the cavity may be made from alternating high and low refractive index layers. For example, the reflector layers 201 and 202 may include alternating layers having thicknesses d1 and d2 with refractive indices n1 and n2 such that $n1d1+n2d2=\lambda/2$, to provide wavelength-selective reflectance at the emission wavelength $\lambda$. This vertical construction may increase compatibility with semiconductor manufacturing equipment. For example, as VCSELs emit light 209 perpendicular to the active region 205, tens of thousands of VCSELs can be processed simultaneously, e.g., by using standard semiconductor wafer processing steps to define the emission area and electrical terminals of the individual VCSELs from a single wafer.

Figure 9:
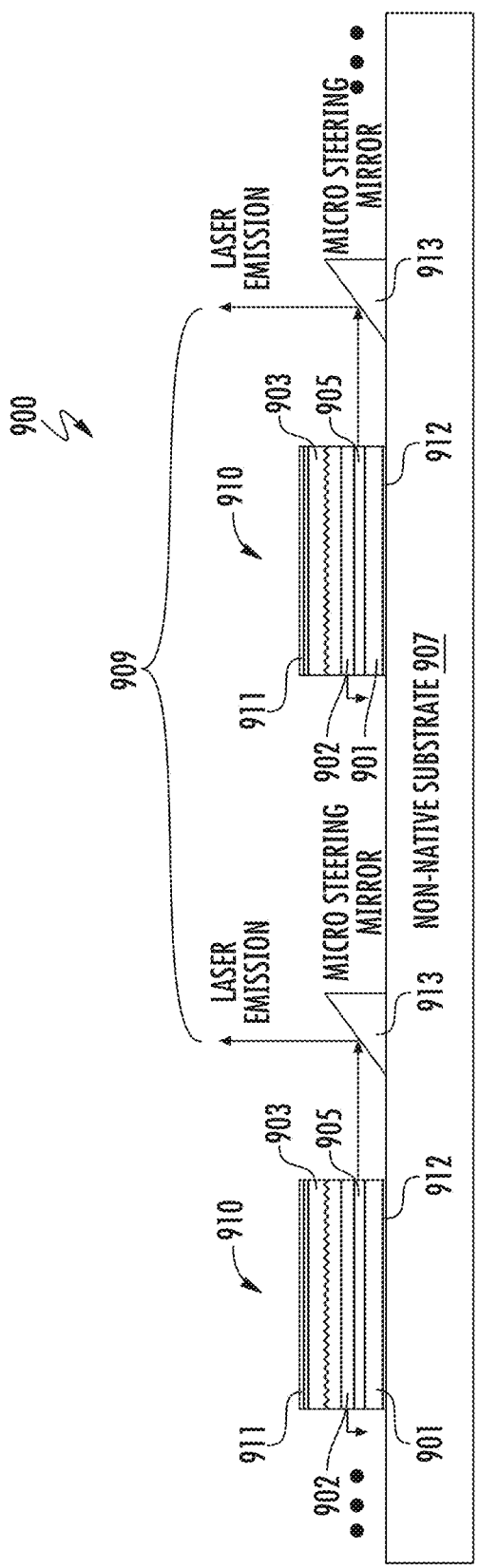
FIG. 9 is a cross-sectional view illustrating an example laser diode array in accordance with further embodiments described herein.

Although described herein primarily with reference to VCSEL structures, it will be understood that embodiments described herein are not limited to VCSELs, and the laser diode 200 may include other types of laser diodes that are configured to emit light 209 along an optical axis 208 that is oriented perpendicular to a substrate or other surface on which the device 200 is provided. It will also be understood that, while described herein primarily with reference to surface-emitting laser structures, laser diodes and laser diode arrays as described herein are not so limited, and may include edge-emitting laser structures that are configured to emit light along an optical axis that is oriented parallel to a substrate or other surface on which the device is provided as well, as shown in the example of FIG. 9.

The VCSEL 200 may be formed of materials that are selected to provide light emission at or over a desired wavelength range, which may be outside of the spectrum of light that is visible to the human eye. For example, the VCSEL 200 may be a gallium arsenide (GaAs)-based structure in some embodiments. In particular embodiments, the active region 205 may include one or more GaAs-based layers (for example, alternating InGaAs/GaAs quantum well/barrier layers), and the Bragg mirrors 201 and 202 may include GaAs and aluminum gallium arsenide ($Al_xGa_{(1-x)}$ As). For instance, the lower Bragg mirror 201 may be an n-type structure including alternating layers of n-AlAs/GaAs, while the upper Bragg mirror 202 may be a p-type structure including alternating layers of p-AlGaAs/GaAs. Although described by way of example with reference to a GaAs-based VCSEL, it will be understood that materials and/or material compositions of the layers 201, 202, and/or 205 may be tuned and/or otherwise selected to provide light emission at desired wavelengths. For example, embodiments described below with reference to FIGS. 10A-13C may be directed to shorter wavelength (e.g., GaN-based) and/or longer wavelength (e.g., InP-based) VCSELs in accordance with embodiments described herein.

In the example of FIGS. 2A and 2B, the VCSEL 200 includes a lasing aperture 210 having a dimension (illustrated as diameter D) of about 12 μm, and first and second electrically conductive contact terminals (illustrated as anode contact 211 and cathode contact 212, also referred to herein as first and second contacts). A first electrically conductive film interconnect 213 is provided on the first contact 211, and a second electrically conductive film interconnect 213 is provided on the second contact 212 to provide electrical connections to the VCSEL 200. FIG. 2B more clearly illustrates the anode contact 211 and cathode contact 212 in cross section, with the conductive film interconnects 213 thereon. The first and second contacts 211 and 212 may provide contacts to semiconductor regions of opposite conductivity type (P-type and N-type, respectively). Accordingly, embodiments described herein are configured for transfer of electric energy to the VCSEL contacts 211 and 212 through thin-film interconnects 213, which may be formed by patterning an electrically conductive film, rather than incorporating wire bonds, ribbons, cables, or leads. The interconnections 213 may be formed after providing the VCSEL 200 on a target substrate (e.g., a non-native substrate that is different from a source substrate on which the VCSEL 200 is formed), for example, using conventional photolithography techniques, and may be constructed to have low resistance. In this regard, materials for the electrically conductive film interconnects 213 may include aluminum or aluminum alloys, gold, copper, or other metals formed to a thickness of approximately 200 nm to approximately 500 nm.

As shown in FIG. 2A, the first and second conductive contacts 211 and 212 are smaller than the aperture 210 in one or more dimensions. In some embodiments, allowing about 2 μm to about 3 μm for the dimensions of each of the contacts 211, 212, the overall dimensions of the VCSEL die 200 can be significantly reduced. For example, for anode and cathode contacts that are 2 μm in length each, a dimension L can be reduced to about 16 ∞m (2 μm anode length+12 μm aperture+2 μm cathode length; all measured along dimension L) providing a 16×16 μm² die. As another example, for anode and cathode contacts that are 3 μm in length each, a dimension L can be reduced to about 18 μm (3 μm anode+12 μm aperture+3 μm cathode) providing a 18×18 μm² die. Die dimensions L may be further reduced or slightly increased for smaller aperture dimensions D (e.g., 10 μm) or larger aperture dimensions D (e.g., 20 μm). More generally, VCSEL dies 200 according to embodiments herein may achieve a contact area-to-aperture area ratio of about 0.05 to 30, about 0.1 to 20, about 1 to 10, or about 1 to 3, where the contact area refers to the surface area of electrical contacts 211 and/or 212 positioned on or adjacent the aperture 210 on the surface S. Also, although illustrated with reference to contacts 211, 212 and interconnections 213 at particular locations relative to the aperture 210, it will be understood that embodiments described herein are not so limited, and the contacts 211, 212 and interconnections 213 may be provided at other areas of the VCSEL die 200 (e.g., at corners, etc.).

VCSELs 200 in accordance with some embodiments described herein may be configured to emit light with greater than about 100 milliwatts (mW) of power within about a 1-10 nanosecond (ns) wide pulse width, which may be useful for LIDAR applications, among others. In some embodiments, more than 1 Watt peak power output with a 1 ns pulse width at a 10,000:1 duty cycle may be achieved from a single VCSEL element 200, due for instance to the reduced capacitance (and associated reduction in RLC time constants) as compared to some conventional VCSELs. VCSELs 200 as described herein may thus allow for longer laser lifetime (based upon low laser operating temperatures at high pulsed power), in combination with greater than about 200 meter (m) range (based on very high power emitter and increased detector sensitivity).

Figure 2C:
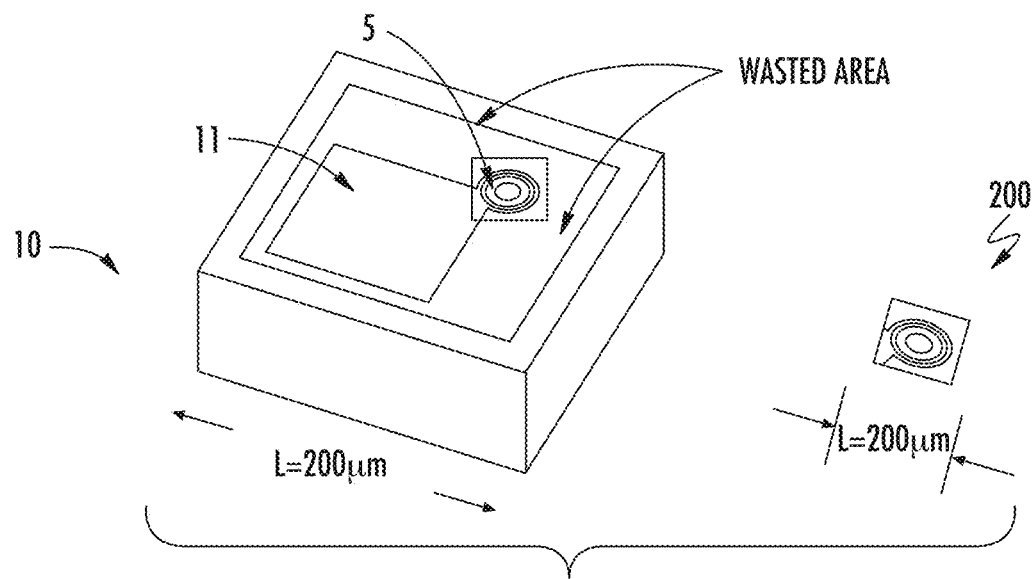
FIG. 2C is a perspective view illustrating an example laser diode in accordance with some embodiments described herein in comparison to a conventional VCSEL chip.

FIG. 2C is a plan view illustrating the VCSEL chip 200 in accordance with some embodiments described herein in comparison to a conventional VCSEL chip 10. As shown in FIG. 2C, the conventional VCSEL chip 10 may have a length L of about 200 μm, to provide sufficient area for the active region 5 and the top conductive wire bond pad 11, which may function as an n-type or p-type contact. In contrast, VCSEL chips 200 in accordance with some embodiments described herein may have a length L of about 20 μm or less. As electrical connections to the smaller contacts 211, 212 are provided by thin-film metallization interconnects 213, VCSEL chips 200 in accordance with some embodiments described herein require no bond pad, such that the optical aperture 210 occupies a majority of the overall surface area of the emitting surface S.

VCSEL chips 200 according to some embodiments of the present invention may thus have dimensions that are $1/100^{th}$ of those of some conventional VCSEL chips 10, allowing for up to one hundred times more power per area of the emitting surface S, as well as reduced capacitance which may substantially reduce the RLC time constants associated with driving fast pulses into these devices. Such an exponential reduction in size may allow for fabrication of VCSEL arrays including thousands of closely-spaced VCSELs 200, some of which are electrically connected in series (or anode-to-cathode) on a rigid or flexible substrate, which may not be possible for some conventional closely spaced VCSELs that are fabricated on a shared electrical substrate. For example, as described in greater detail below, multiple dies 200 in accordance with some embodiments described herein may be assembled and electrically connected within the footprint of the conventional VCSEL chip 10. In some applications, this size reduction and elimination of the bond pad may allow for reduction in cost (of up to one hundred times), device capacitance, and/or device thermal output, as compared to some conventional VCSEL arrays.

FIG. 3A is a perspective view illustrating a distributed emitter array 300a including laser diodes (illustrated as VCSELs 200) in accordance with some embodiments described herein. The array 300a (also referred to herein as a distributed VCSEL array (DVA)) may be assembled on a non-native substrate 307a, for example, by micro-transfer printing, electrostatic adhesion, or other mass transfer techniques. As used herein, a non-native substrate (also referred to herein as a target substrate) may refer to a substrate on which the laser diodes 200 are arranged or placed, which differs from a native substrate on which the laser diodes 200 are grown or otherwise formed (also referred to herein as a source substrate). The substrate 307a may be rigid in some embodiments, or may be flexible in other embodiments, and/or may be selected to provide improved thermal characteristics as compared to the source substrate. For example, in some embodiments the non-native substrate 307a may be thermally conducting and also electrically insulating (or coated with an insulating material, such as an oxide, nitride, polymer, etc.). Electrically conductive thin-film interconnects 313 may be formed to electrically connect respective contacts of the laser diodes 200 in series and/or parallel configurations, and may be similar to the interconnects 213 described above. This may allow for dynamically adjustable configurations, by controlling operation of subsets of the laser diodes 200 electrically connected by the conductive thin-film interconnects 313. In some embodiments, the array 300a may include wiring 313 between VCSELs 200 that are not connected in parallel (e.g., connections without a shared or common cathode/anode). That is, the electrically conductive thin-film interconnects 313 may provide numerous variations of series/parallel interconnections, as well as additional circuit elements which may confer good yield (e.g. bypass routes, fuses, etc.).

The conductive thin-film interconnects 313 may be formed in a parallel process, before and/or after providing the laser diodes 200 on the substrate 307a. For example, the conductive thin-film interconnects 313 may be formed by patterning an electrically conductive film on the substrate 307a using conventional photolithography techniques, such that the laser diodes 200 of the array 300 are free of electrical connections through the substrate 307a.

Due to the small dimensions of the laser diodes 200 and the connections provided by the conductive thin-film interconnects 313, a spacing or pitch between two immediately adjacent laser diodes 200 is less than about 500 micrometers (μm), or in some embodiments, less than about 200 μm, or less than about 150 μm, or less than about 100 μm, or less than about 50 μm, without connections to a shared or common cathode/anode. While some monolithic arrays may provide inter-laser diode spacings of less than about 100 μm, the laser diodes of such arrays may electrically share a cathode/anode and may mechanically share a rigid substrate in order to achieve such close spacings. In contrast, laser diode arrays as described herein (such as the array 300a) can achieve spacings of less than about 500 μm between immediately adjacent, serially-connected laser diodes 200 (that do not have a common anode or cathode connection), on non-native substrates (e.g., rigid or flexible substrates) in some embodiments. In addition, as described below with reference to the examples of FIGS. 6A-6C, some embodiments of the present disclosure may integrate other types of devices and/or devices formed from different materials (e.g. power capacitors, FETs, etc.) in-between laser diodes 200 at the sub-500 μm spacings described herein.

Also, in some embodiments, a concentration of the laser diodes 200 per area of the array 300a may differ at different portions of the array 300a. For example, some LIDAR sensor applications may benefit from higher resolution in a central portion of the array (corresponding to a forward direction of travel), but may not require such high resolution at peripheral regions of the array. As such, a concentration of VCSELs 200 at peripheral portions of the array 300a may be less than a concentration of VCSELs 200 at a central portion of the array 300a in some embodiments. This configuration may be of use in applications where the substrate is flexible and may be curved or bent in a desired shape, as shown in FIG. 3B.

Figure 3B:
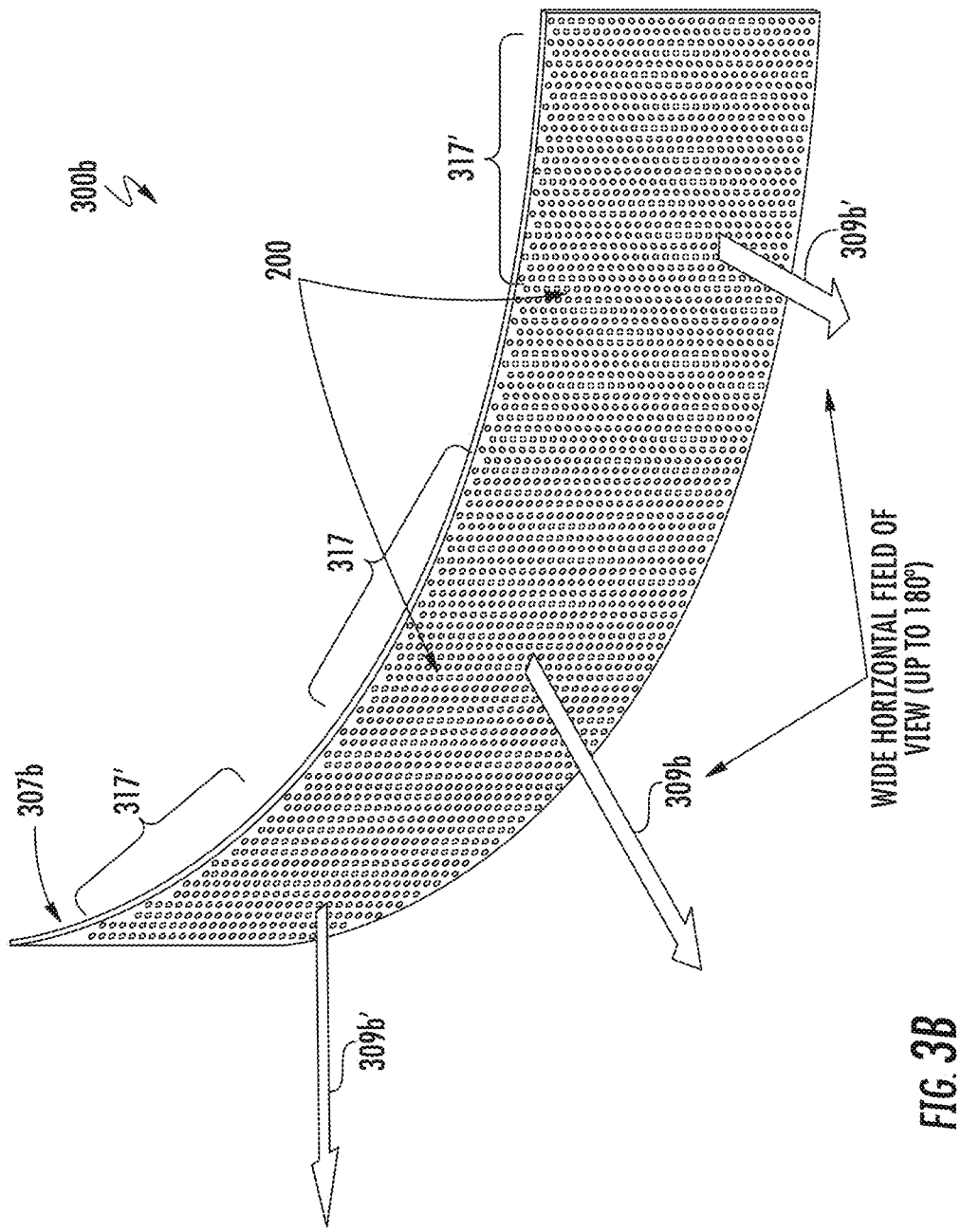
FIG. 3B is a perspective view illustrating a distributed emitter array including laser diodes on a curved substrate in accordance with some embodiments described herein.

FIG. 3B is a perspective view illustrating a distributed emitter array 300b including laser diodes 200 on a curved, non-native substrate 307b in accordance with some embodiments described herein. In some embodiments, the substrate 307b is formed of a flexible material that can be bent to provide curved emitting surface, such that VCSELs 200 mounted on a central portion 317 of the substrate 307b face a forward direction, while VCSELs 200 mounted on peripheral portions 317' of the substrate 307b face oblique directions. As the VCSELs 200 respectively emit light in a direction perpendicular to their active regions, the VCSELs 200 mounted on the central portion 317 emit light 309 in the forward direction, while the VCSELs 200 mounted on peripheral portions 317' of the substrate 307b emit light 309' in oblique directions, providing a wide field of view. In some embodiment, each VCSEL may provide narrow-field illumination (e.g., covering less than about 1 degree), and the arrays 300a, 300b may include hundreds or thousands of VCSELs 200 (e.g., an array of 1500 VCSELs, each covering a field of view of about 0.1 degree, can provide a 150 degree field of view).

The field of view can be tailored or changed as desired from 0 degrees up to about 180 degrees by altering the curvature of the substrate 307b. The curvature of the substrate 307b may or may not be constant radius, and can thereby be designed or otherwise selected to provide a desired power distribution. For example, the substrate 307b may define a cylindrical, acylindrical, spherical or aspherical curve whose normal surfaces provide a desired distribution of relative amounts of power. In some embodiments, the curvature of the substrate 307b may be dynamically altered by mechanical or electro-mechanical actuation. For example, a mandrel can be used to form the cylindrical or acylindrical shape of the flexible non-native substrate 307b. The mandrel can also serve as a heat sink in some embodiments. Also, as mentioned above, a spatial density or concentration of VCSELs 200 at peripheral portions of the array 300b may be less than a concentration of VCSELs 200 at a central portion of the array 300b in some embodiments.

The arrays 300a and 300b illustrated in FIGS. 3A and 3B may be scalable based on a desired quantity or resolution of laser diodes 200, allowing for long range and high pulsed power output (on the order of kilowatts (kW)). The spatial density or distribution of the laser diodes 200 on the surfaces of the substrates 307a and 307b can be selected to reduce optical power density, providing both long range and eye safety at a desired wavelength of operation (e.g., about 905 nm for GaAs VCSELs; about 1500 nm for InP VCSELs). A desired optical power density may be further achieved by controlling the duty cycle of the signals applied to the VCSELs and/or by altering the curvature of the substrate. Also, the separation or spacing between adjacent laser diodes 200 within the arrays 300a and 300b may be selected to provide thermal management and improve heat dissipation during operation, depending on the substrate material. For example, a spacing between two immediately adjacent laser diodes 200 of greater than about 100 μm micrometers (μm) may provide thermal benefits, especially for substrates with limited thermal conductivity. The arrays 300a and 300b as described herein may thereby provide greater reliability, by eliminating wire bonds, providing a fault-tolerant architecture, and/or providing lower operating temperatures. In further embodiments, self-aligning, low-cost beam forming micro-optics (e.g., ball lens arrays) may be integrated on or into the surface of the arrays 300a and 300b.

The compact arrays 300a and 300b shown in FIGS. 3A and 3B may be fabricated in some embodiments using micro-transfer printing (MTP), electrostatic adhesion, and/or other massively parallel chip handling techniques that allow simultaneous assembly and heterogeneous integration of thousands of micro-scale devices on non-native substrates via epitaxial liftoff. For example, the arrays of VCSELs 200 can be fabricated using micro-transfer printing processes similar to those described, for example, in U.S. Pat. No. 7,972,875 to Rogers et al. entitled "Optical Systems Fabricated By Printing-Based Assembly," the disclosure of which is incorporated by reference herein in its entirety. The arrays of VCSELs 200 can alternatively be fabricated using electrostatic adhesion or gripping transfer techniques similar to those described, for example in U.S. Pat. No. 8,789,573 to Bibl et al. entitled "Micro device transfer head heater assembly and method of transferring a micro device," the disclosure of which is incorporated by reference herein in its entirety. In some embodiments, MTP, electrostatic adhesion, and/or other mass transfer techniques may allow for fabrication of VCSEL or other arrays of laser diodes with the small inter-device spacings described herein.

Figure 4A:
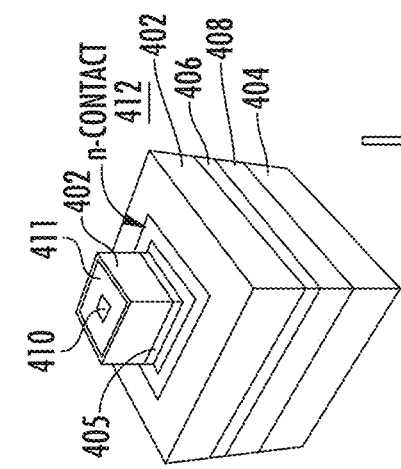
FIGS. 4A-4F are perspective views illustrating an example fabrication process for laser diodes in accordance with some embodiments described herein.

FIGS. 4A-4F are perspective views and FIGS. 4A'-4G' are cross-sectional views illustrating an example fabrication process for laser diodes (illustrated as VCSELs 400) in accordance with some embodiments described herein. The VCSELs 200 described herein may also be fabricated using one or more of the processing operations shown in FIGS. 4A-4F in some embodiments. As shown in FIGS. 4A-4F and FIGS. 4A'-4G', ultra small VCSELs 400 in accordance with embodiments described herein can be grown on source substrates and assembled on a non-native target substrate using micro-transfer printing techniques. In particular, in FIGS. 4A and 4A', sacrificial layer 408, a lateral conduction layer 406, a first, n-type distributed Bragg reflector (DBR) layer 401, an active region 405, and a second, p-type DBR layer 402 are sequentially formed on a source wafer or substrate 404. Although illustrated with reference to a single VCSEL 400 to show fabrication, it will be understood that a plurality of VCSELs 400 may be simultaneously fabricated on the source wafer 404, with reduced or minimal spacing between adjacent VCSELs 400 to increase or maximize the number of VCSELs that may be simultaneously fabricated on the wafer 404. Also, it will be understood that a plurality of VCSEL devices may be fabricated on a single die or chiplet that is released from the substrate 404 for printing. Also, the transfer techniques described in greater detail below may allow for reuse of the source wafer 404 for subsequent fabrication of additional VCSELs.

In some embodiments, the material compositions of the layers 406, 401, 405, and 402 may be selected to provide a desired emission wavelength and emission direction (optical axis). For example, the layers 406, 401, 405, and 402 may be gallium arsenide (GaAs)-based or indium phosphide (InP)-based in some embodiments. As illustrated, a lateral conduction layer 406, an AlGaAs n-type high-reflectivity distributed Bragg reflector (DBR), and an active region 405 are sequentially formed on the source wafer 404. The active region 405 may be formed to include InAlGaAs strained quantum wells designed to provide light emission over a desired wavelength, and is followed by formation of a p-type DBR output mirror 402. A top contact metallization process is performed to form a p-contact (e.g., an anode contact) 411 on the p-type DBR layer 402. For example, Ti/Pt/Au ring contacts of different dimensions may be deposited to form the anode or p-contact 411. An aperture 410 may be defined within a perimeter of the p-contact 411. In some embodiments, an oxide layer may be provided between the active region 405 and the p-type DBR layer 402 to define boundaries of the aperture 410. The placement and design of the aperture 410 may be selected to minimize optical losses and current spreading.

Figure 4C:
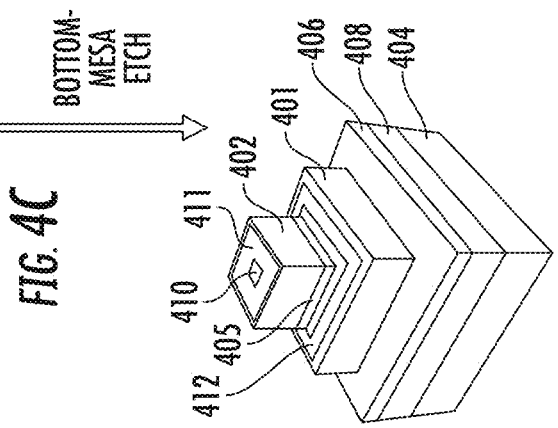
Figure 4B:
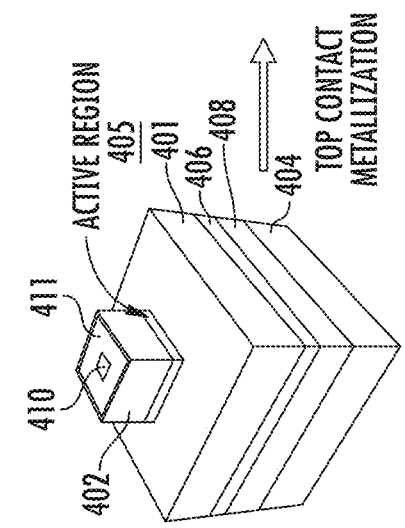
Figure 4D:
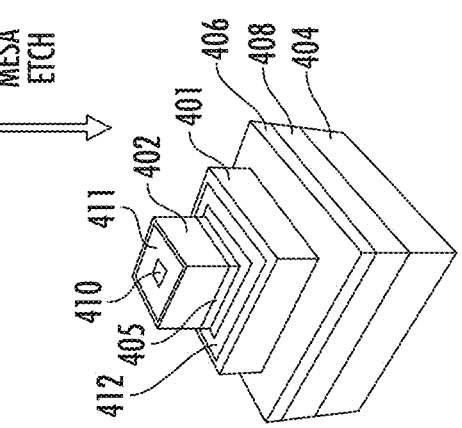

In FIGS. 4B and 4B', a top mesa etching process is performed to expose the active region 405 and a top surface of the n-type DBR layer 401, and an oxidation process is performed to oxidize the exposed surfaces, (including the exposed sidewalls of the active region 405), and in particular to laterally define boundaries of the optical aperture 410. In FIGS. 4C and 4C', a bottom contact metallization process is performed to expose and form an n-type (e.g., cathode) contact 412 on a surface of the lateral conduction layer 406. It will be understood that, in some embodiments, the n-type contact 412 may alternatively be formed on the n-type DBR layer 401 to provide the top-side contact. In FIGS. 4D and 4D', an isolation process is performed to define respective lateral conduction layers 406, and an anchor material (e.g., photoresist layer) is deposited and etched to define photoresist anchors 499 and inlets to expose sacrificial release layer 408 for epitaxial lift-off.

Figure 4F:
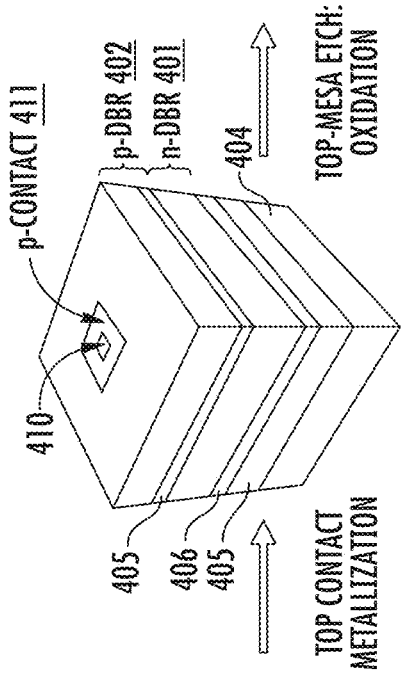
Figure 4E:
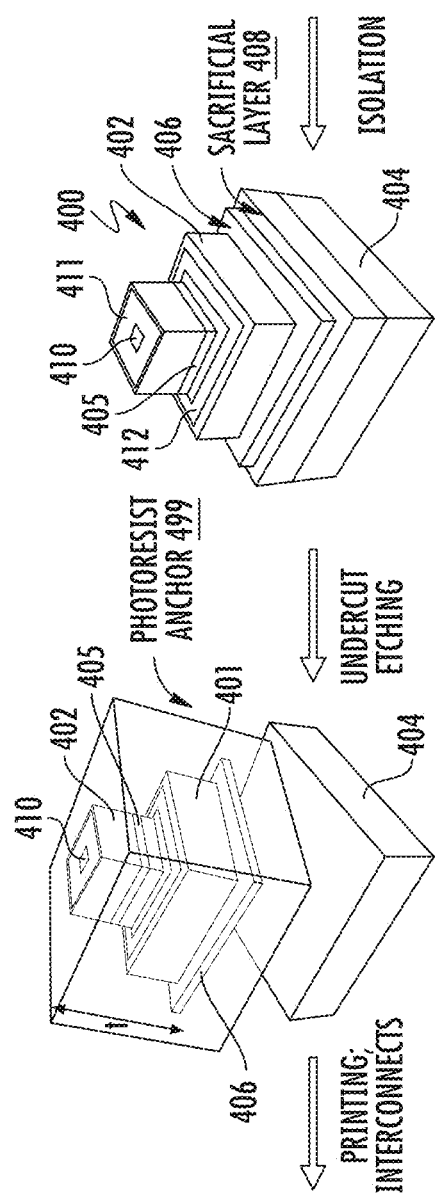

In FIGS. 4E and 4E', an undercut etching process is performed to remove portions of the sacrificial release layer 408 such that the anchors 499 suspend the VCSEL die 400 over the source wafer 404. In some embodiments, the operations of FIGS. 4E and 4E' may be followed by a micro-transfer printing process, as shown in FIGS. 4F and 4F', which may utilize an elastomeric and/or other stamp 490 to break the anchors 499, adhere the VCSEL die 400 (along with multiple other VCSEL dies 400 on the source wafer 404) to a surface of the stamp 490, and simultaneously transfer the multiple VCSEL dies 400 (which have been adhered to the surface of the stamp) to a non-native target substrate 407 by contacting the surface of the stamp including the dies 400 thereon with a surface of the non-native target substrate 407, as shown in FIG. 4G'. In other embodiments, the operations of FIG. 4F may be followed by an electrostatic gripper-based transfer process, which may utilize an electrostatic transfer head to adhere the VCSEL die 400 (along with multiple other VCSEL dies 400 on the source wafer 404) to a surface of the head using the attraction of opposite charges, and simultaneously transfer the VCSEL dies 400 to a non-native target substrate. As a result of breaking the anchors 499, each VCSEL die 400 may include a broken or fractured tether portion 499t (e.g., a residual portion of the anchor structure 499) protruding from or recessed within an edge or side surface of the die 400 (and/or a corresponding relief feature at a periphery of the die 400), which may remain upon transfer of the VCSEL dies 400 to the non-native substrate 407.

The non-native target substrate may be a rigid or flexible destination substrate for the VCSEL array, or may be a smaller interposer or "chiplet" substrate. Where the target substrate is the destination substrate for the array, an interconnection process may form a conductive thin film layer on the target substrate including the assembled VCSEL dies 400 thereon, and may pattern the conductive thin film layer to define thin-film metal interconnects that provide desired electrical connections between the VCSEL dies 400. The interconnection process may be performed after the VCSEL dies 400 are assembled on the destination substrate, or may be performed in a pre-patterning process on the destination substrate before the VCSEL dies 400 are assembled such that the electrical connections between the VCSEL dies 400 are realized upon assembly (with no interconnection processing required after the transfer of the dies 400 onto the substrate). Where the target substrate is a chiplet, the VCSEL dies 400 may be connected in parallel via the chiplet. The chiplets including the VCSEL dies 400 thereon may then be assembled (via transfer printing, electrostatic adhesion, or other transfer process) onto a destination substrate for the array, which may be pre- or post-patterned to provide electrical connections between the chiplets. The thin-film metal interconnects may be defined on and/or around the broken tether portion 499t protruding from the edge of the die(s) 400 in some embodiments.

Because the VCSELs 400 are completed via epitaxial lift-off and thus are separated from the substrate, and because of the use of thin film interconnects, the VCSELs 400 may also be thinner than some conventional VCSELs which remain connected to their native substrate, such as the VCSEL 10 of FIG. 2C. For example, the VCSEL 400 may have a thickness t (e.g., a combined thickness of the semiconductor stack including the layers 406, 401, 405, and 402) of about 1 micrometers (μm) to about 20 μm.

Figure 5A:
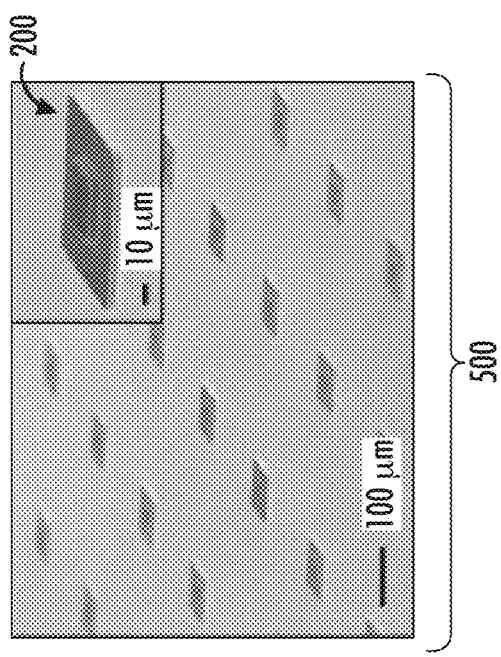
FIGS. 5A-5C are images of VCSEL arrays assembled in accordance with some embodiments described herein.
Figure 5B:
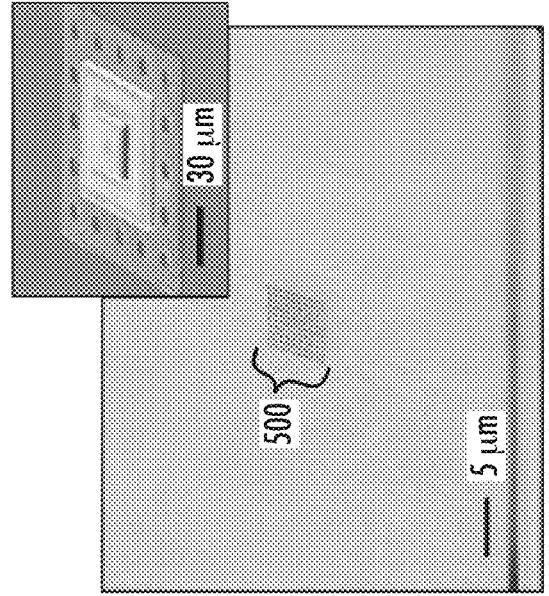
Figure 5C:
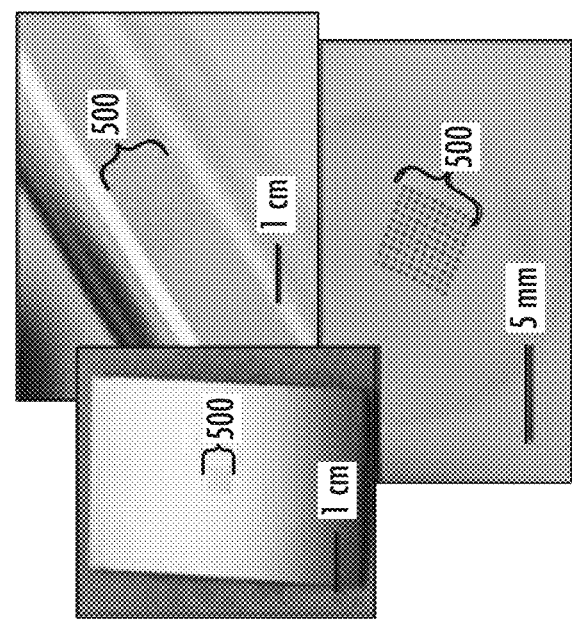

FIGS. 5A-5C are images of VCSEL arrays 500 in accordance with some embodiments described herein, which were assembled using micro-transfer printing processes. In particular, FIG. 5A illustrates a VCSEL array 500 of about 11,000 lasers with an inter-VCSEL spacing of about 200 micrometers (μm) or less between adjacent VCSELs 200 after assembly on a non-native substrate 507, with the inset image of FIG. 5B and the image of 5C illustrating magnified views of portions of the array 500 including about 350 lasers and 9 lasers, respectively, in accordance with some embodiments described herein. Due to the reduction in dimensions of the VCSELs described herein, the inter-VCSEL spacing between immediately adjacent VCSELs 200 may be less than about 500 μm, or less than about 100 μm or less than about 50 μm on the source substrate in some embodiments. In some embodiments, the array 500 may include 100 VCSELs or more within a footprint or area of 5 square millimeters (mm$^2$) or less.

Figure 5D:
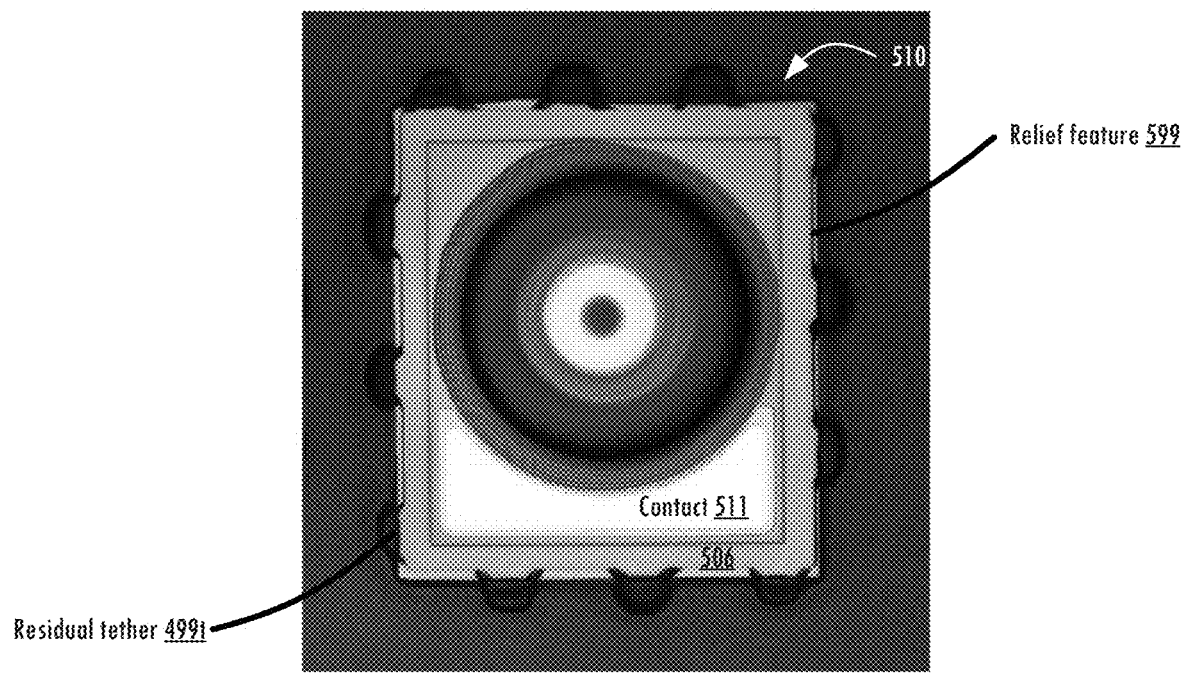
FIGS. 5D-5E are magnified images illustrating broken tether portions and relief features of VCSELs in accordance with some embodiments described herein.
Figure 5E:
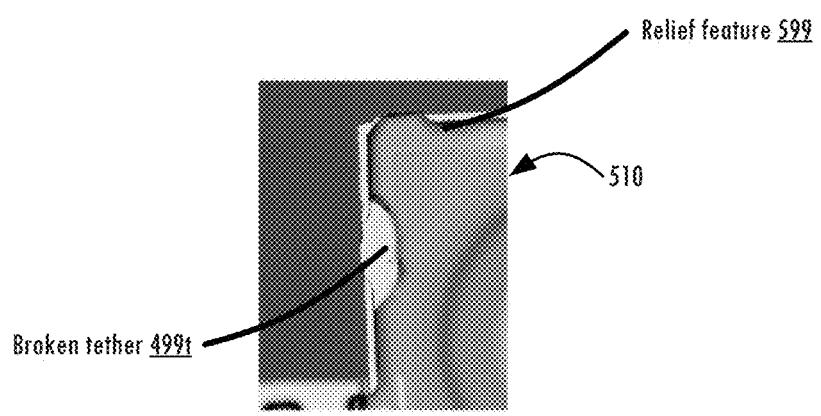

FIGS. 5D-5E are magnified images illustrating broken tether portions and relief features of VCSEL structures in accordance with some embodiments described herein. As shown in FIGS. 5D and 5E, a transfer-printed VCSEL 510 (such as one of the VCSELs 200) or other laser diode as described herein may include one or more residual or broken tether portions 499t and/or relief features 599 at a periphery thereof. The relief features 599 may be patterned or otherwise provided along the periphery of VCSEL 510 to partially define the tethers 499 and areas for preferential fracture of the tethers 499. In the examples of FIGS. 5D-5E, the broken tether portions 499t and relief features 599 are illustrated as being present along a periphery of the lateral conduction layer (LCL) 506; however, it will be understood that broken tether portions 499t and/or relief features 599 may be present in or along a periphery of any of the layers that may be provided on a non-native substrate by transfer-printing processes described herein, for example, any of the epitaxially grown layers 406, 405, 401, 402 formed in fabricating the active region 405 on a source wafer or substrate 404 in the examples of FIGS. 4A-4F and 4A'-4G'. As such, in some embodiments, the broken tether portion 499t may comprise a material and thickness corresponding to that of the LCL layer 506 (or other layer associated with the active region). In further embodiments, to shorten an etch sequence, peripheral or edge portions of the LCL 506 may be partially etched, and as such, the relief pattern 599 of the tether features 499t may be thinner than the LCL 506

(or other layer associated with the active region). The fracture of the tethers 499 during the "Pick" operation (such as shown in FIG. 4G') may occur in the resist layer 499*l* itself, and the broken tether portions 499*t* may comprise a material and thickness corresponding to that of the resist layer 499*l*. The broken tether portion 499*t* may interact with the print adhesive or epoxy, and also remains on the fully processed device, even after resist develop and/or resist removal processes. More generally, some laser diode structures in accordance with embodiments described herein may include at least one of a broken tether portion 499*t* or a relief pattern or feature 599 along a periphery or edge of the laser diode structure.

Accordingly, some embodiments described herein may use MTP to print and integrate hundreds or thousands of VCSELs or other surface-emitting laser diodes into small-footprint light-emitting arrays. MTP may be advantageous by allowing simultaneous manipulation and wafer-level assembly of thousands of laser diode devices. In some embodiments, each of the laser diodes may have aperture dimensions as small as about 1-10 µm, thereby reducing the size (and cost) of lasers incorporating such VCSEL arrays by a factor of up to 100. Other embodiments may include substrates with aperture dimensions even smaller than about 1 µm in order to realize different performance such as modified near and far field patterns. Still other embodiments may use larger apertures, for example, about 10-100 µm, in order to realize higher power output per VCSEL device. Also, MTP allows reuse of the source wafer (e.g., GaAs or InP) for growth of new devices after the transfer printing process, further reducing fabrication costs (in some instances, by up to 50%). MTP may also allow heterogeneous integration and interconnection of laser diodes of different material systems (e.g., GaAs or InP lasers) and/or driver transistors (as discussed below) directly onto silicon integrated circuits (ICs). Also, source wafers may be used and reused in a cost-effective manner, to fabricate laser diodes (e.g., InP-based VCSELs) that can provide high power with eye safety, as well as reduced ambient noise. As such, MTP may be used in some embodiments to reduce emitter costs, and allow fabrication of high power, high resolution distributed VCSEL arrays (DVAs) including multiple hundreds or thousands of VCSELs.

Also, when provided on flexible or curved substrates, embodiments described herein can provide DVAs having a wide field of view (FoV), up to 180 degrees horizontal. In some embodiments, the optical power dispersed via the DVA can be configured for eye safety and efficient heat dissipation. In some embodiments, low-cost, self-aligning, beam forming micro-optics may be integrated within the curved DVA.

Figure 6B:
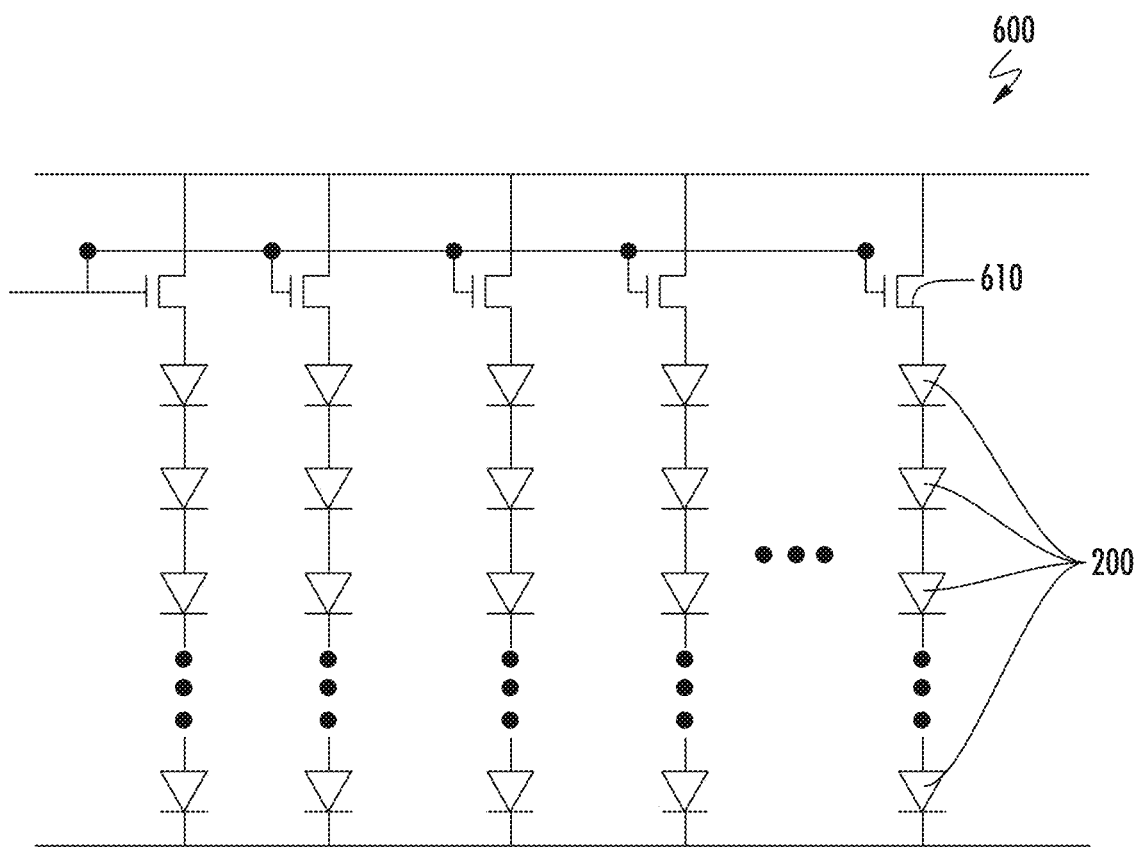
FIG. 6B is schematic view illustrating an equivalent circuit diagram for the distributed emitter array of FIG. 6A.

FIG. 6A is a perspective view illustrating an example emitter array 600 including heterogeneous integration of distributed surface-emitting laser diodes (illustrated as VCSELs 200) and distributed driver transistors 610 in accordance with some embodiments described herein. As used herein, distributed circuit elements may refer to laser diodes, driver transistors, and/or other circuit elements that are assembled in various desired positions throughout a laser diode array, and such an array of distributed circuit elements is referred to herein as a distributed array. For example, integration of distributed high power driver transistors in a distributed VCSEL array may be advantageous for LIDAR applications. FIG. 6B is schematic view illustrating an equivalent circuit diagram for the distributed emitter array 600 of FIG. 6A, and FIG. 6C is a cross-sectional view of the distributed emitter array 600 taken along line 6C-6C' of FIG. 6A.

Figure 6C:
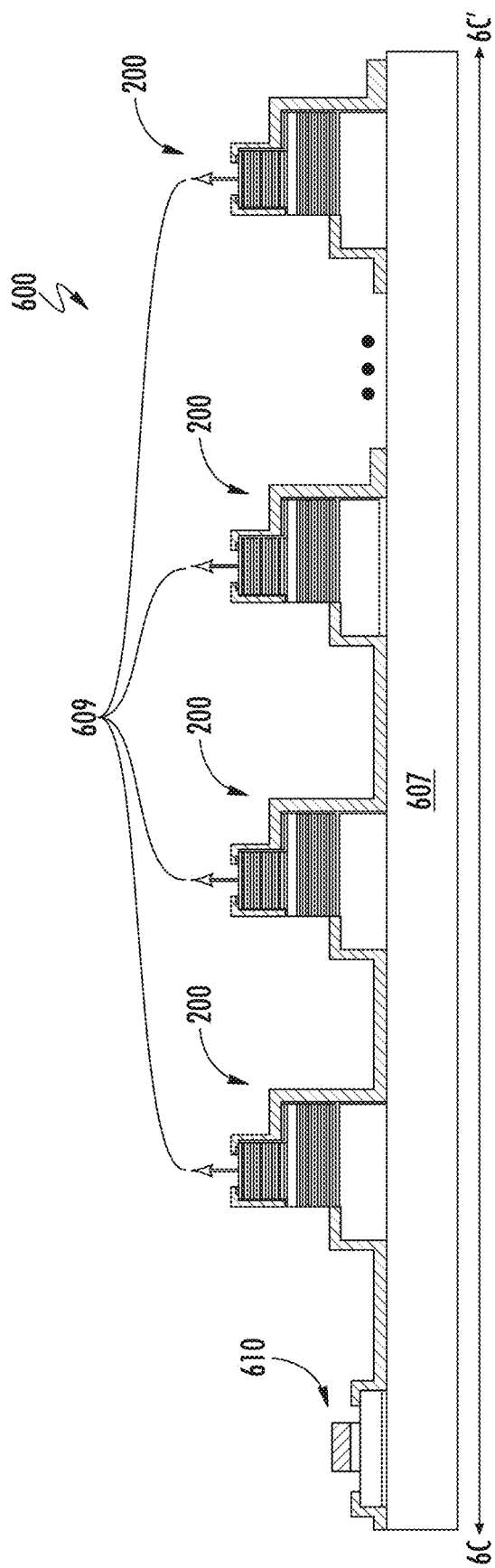
FIG. 6C is a cross-sectional view of the distributed emitter array taken along line 6C-6C' of FIG. 6A.

As shown in FIGS. 6A-6C, the array 600 (also referred to herein as a DVA) may be assembled on a non-native substrate 607, for example, by micro-transfer printing or other techniques. The substrate 607 may be rigid in some embodiments, or may be flexible in other embodiments. The array 600 further includes integrated driver transistors 610 that are assembled on the substrate 607 adjacent to one or more of the VCSELs 200. In some embodiments, the drivers 610 and laser diodes 200 may include different semiconductor materials and/or technologies that have incompatible fabrication processes. For example, the driver transistors 610 may be assembled on the substrate 607 using a micro-transfer printing (MTP) process. In some embodiments, an array including hundreds or thousands of driver transistors 610 may be provided. Electrically conductive thin-film interconnects 613 may be formed to electrically connect respective contacts of the driver transistors 610 and laser diodes 200 in series and/or parallel configurations. Spacings between a driver transistor 610 and an immediately adjacent laser diode 200 may be less than about 2 millimeters, less than about 1 millimeter, less than about 500 micrometers, less than about 150 micrometers (µm), or in some embodiments, less than about 100 µm, or less than about 50 µm, which may provide reduced parasitic impedance therebetween (e.g., up to 100 times lower than where the driver transistor 610 is located off-chip or off-substrate).

In some embodiments, the array 600 may include wiring 613 between VCSELs 200 that are not connected in parallel (e.g., no common cathode/anode). Interconnection designs that do not simply place all elements of the array in parallel (e.g., without a common anode or cathode connection) may offer the advantage of lowering current requirements for the array, which can reduce inductive losses and increase switching speed. Varied interconnection designs also provide for the inclusion of other devices embedded or integrated within the electrically interconnected array (e.g., switches, gates, FETs, capacitors, etc.) as well as structures which enable fault tolerance in the manufacture of the array (e.g. fuses, bypass circuits, etc.) and thus confer yield advantages. For example, as illustrated in FIG. 6B, the array 600 includes a plurality of strings of VCSELs 200 that are electrically connected in series (or anode-to-cathode) to define columns (or other subsets or sub-arrays) of the array 600. The array 600 further includes an array of driver transistors 610, with each driver 610 electrically connected in series with a respective string of serially- or anode-to-cathode-connected VCSELs 200.

The conductive thin-film interconnects 613 may be formed in a parallel process after providing the laser diodes 200 and driver transistors 610 on the substrate 607, for example by patterning an electrically conductive film using conventional photolithography techniques. As such, the driver transistors 610 and laser diodes 200 of the array 600 are free of wire bonds and/or electrical connections through the substrate 607. Due to the smaller dimensions of the laser diodes 200 and the driver transistors 610 and the degree of accuracy of the assembly techniques described herein, a spacing between immediately adjacent laser diodes 200 and/or driver transistors 610 may be less than about 150 micrometers (µm), or in some embodiments, less than about 100 µm or less than about 50 µm. Integrating the driver transistors 610 on the substrate 607 in close proximity to the VCSELs 200 (for example, at distances less than about 2 millimeters, less than about 1 millimeter, less than about 500 micrometers, less than about 150 micrometers (μm), or in some embodiments, less than about 100 μm, or less than about 50 μm from a nearest VCSEL 200) may thus shorten the electrical connections 613 between elements, thereby reducing parasitic resistance, inductance, and capacitance, and allowing for faster switching response.

In the example of FIGS. 6A-6C, the driver transistors 610 are arranged in an array such that each driver transistor 610 is connected in series with a column (or other subset) of serially-connected (or otherwise anode-to-cathode-connected) VCSELs 200, allowing for individual control of respective columns/strings of VCSELs 200. However, it will be understood that embodiments described herein are not limited to such a connection configuration. To the contrary, integrating the driver transistors 610 in close proximity to the VCSELs 200 may also allow for greater flexibility in wiring configurations (e.g., in series and/or parallel), which may be used to control current and/or increase or maximize performance. For example, fewer or more driver transistors 610 may be provided (e.g., drivers for control of rows of serially-connected VCSELs 200 as well as columns) for finer control of respective VCSELs or groups of VCSELs and/or output power. Another example would be the addition of capacitors or similar electrical storage devices close to the elements of the array for faster pulse generation, for example, on the order of sub-nanosecond (ns), in contrast to some conventional designs that may be on the order of about 1-10 ns or more. Likewise, although illustrated as a planar array 600, the substrate 607 may be flexible in some embodiments; thus, the array 600 may be bent to provide a desired curvature, similar to the array 300b of FIG. 3B.

As similarly discussed above with reference to the arrays 300a and 300b, the array 600 may be scalable based on a desired quantity or resolution of laser diodes 200, allowing for long range and high pulsed power output (on the order of kilowatts (kW)). The distribution of the laser diodes 200 on the surfaces of the substrate 607 can be selected and/or the operation of the laser diodes can be dynamically adjusted or otherwise controlled (via the transistors 610) to reduce optical power density, providing both long range and eye safety at a desired wavelength of operation (e.g., about 905 nm for GaAs VCSELs; about 1500 nm for InP VCSELs). Also, the spacing between elements 200 and/or 610 may be selected to provide thermal management and improve heat dissipation during operation. Arrays 600 as described herein may thereby provide improved reliability, by eliminating wire bonds, providing a fault-tolerant architecture, and/or providing lower operating temperatures. In further embodiments, self-aligning, low-cost beam forming micro-optics (e.g., ball lens arrays) may be integrated on or into the surface of the substrate 607.

Figure 7A:
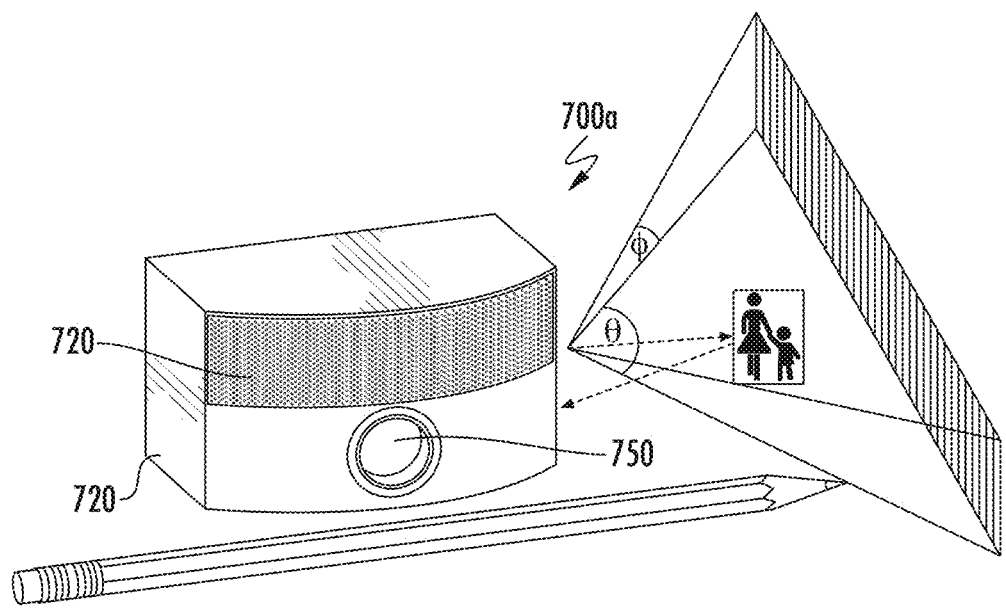
FIG. 7A is a perspective view illustrating an example LIDAR device in accordance with some embodiments described herein.

FIG. 7A is a perspective view illustrating a LIDAR device 700a including surface-emitting laser diodes (such as the VCSELs 200) in accordance with embodiments described herein, illustrated relative to a pencil for scale. FIG. 7C is a perspective view illustrating an alternative LIDAR device 700c in accordance with embodiments described herein. In particular, FIGS. 7A and 7C illustrate a distributed vertical-cavity-surface-emitting laser (VCSEL) array-based, solid-state Flash LIDAR device 700a, 700c. The LIDAR device 700a, 700c is illustrated with reference to a curved array 720, such as the curved array 300b of FIG. 3B, but it will be understood that the LIDAR device 700a, 700c is not so limited, and may alternatively implement the array 300a of FIG. 3A, the array 600 of FIGS. 6A-6C, and/or other arrays of laser diodes 200 that provide features described herein. Such features of the device 700a, 700c may include, but are not limited to, broad field of view (in particular embodiments, about θ=120° horizontal by φ=10° vertical, or broader); long range (in some instances, greater than about 200 m); high resolution (in particular embodiments, about 0.1° horizontal and vertical) compact size defined by reduced dimensions (in particular embodiments, about 110× 40×40 mm); high power (in particular embodiments, about 10,000 w peak, pulsed); and eye safety (in particular embodiments, dispersed optical power can support eye safe, high power, 905 nm (e.g., GaAs) and/or about 1500 nm (e.g., InP) emitters).

Figure 7B:
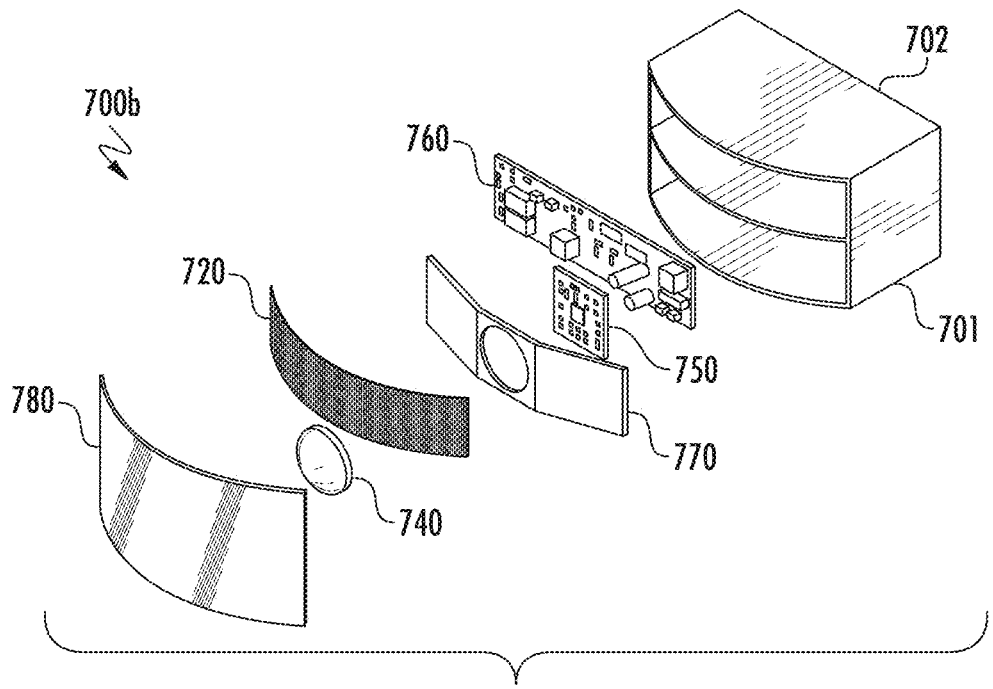
FIG. 7B is an exploded view illustrating example components of the LIDAR device of FIG. 7A.
Figure 7C:
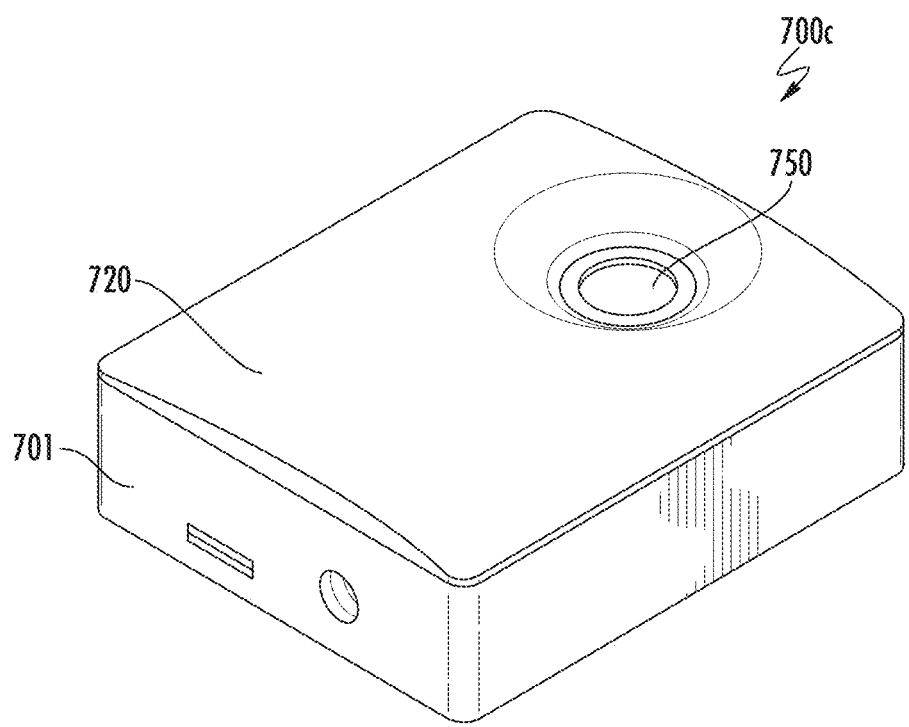
FIG. 7C is a perspective view illustrating another example LIDAR device in accordance with some embodiments described herein.

FIG. 7B is an exploded view 700b illustrating components of the LIDAR device 700a of FIG. 7A. As shown in FIG. 7B, the device housing or enclosure 701 includes a connector 702 for electrical connection to a power source and/or other external devices. The enclosure 701 is sized to house a light emitter array 720, a light detector array 730, electronic circuitry 760, detector optics 740 (which may include one or more lenses and/or optical filters), and a lens holder 770. A transparent cover 780 is provided to protect the emitter array 720 and detector optics 740, and may include beam shaping and/or filtering optics in some embodiments.

The light emitter array 720 may be a pulsed laser array, such as any of the VCSEL arrays 300a, 300b, 600 described herein. As such, the light emitter array 720 may include a large quantity (e.g., hundreds or even thousands) of distributed, ultra small laser diodes 200, which are collectively configured to provide very high levels of power (by exploiting benefits of the large number of very small devices). Using a large number of small devices rather than a small number of large devices allows devices that are very fast, low power and that operate at a low temperature to be integrated in an optimal configuration (with other devices, such as transistors, capacitors, etc.) to provide performance not as easily obtained by a small number of larger laser devices. As described herein the laser diodes 200 may be transfer printed simultaneously onto a non-native curved or flexible substrate in some embodiments. Beam shaping optics that are configured to project high aspect ratio illumination from the light emitter array 720 onto a target plane may also be provided on or adjacent the light emitter array 720.

The light detector array 730 may include one or more optical detector devices, such as pin, pinFET, linear avalanche photodiode (APD), silicon photomultiplier (SPM), and/or single photon avalanche diode (SPAD) devices, which are formed from materials or otherwise configured to detect the light emitted by the light emitter array 720. The light detector array 730 may include a quantity of optical detector devices that are sufficient to achieve a desired sensitivity, fill factor, and resolution. In some embodiments, the light detector array 730 may be fabricated using microtransfer printing processes as described herein. The detector optics 740 may be configured to collect high aspect ratio echo and focus target images onto focal plane of the light detector array 730, and may be held on or adjacent the light detector array 730 by the lens holder 770.

The electronic circuitry 760 integrates the above and other components to provide multiple return LIDAR point cloud data to data analysis. More particularly, the electronic circuitry 760 is configured to control operation of the light emitter array 720 and the light detector array 730 to output filtered, high-quality data, such as 3D point cloud data, to one or more external devices via the connector 702. The external devices may be configured to exploit proprietary and/or open source 3D point cloud ecosystem and object classification libraries for analysis of the data provided by the LIDAR device 700a, 700c. For example, such external devices may include devices configured for applications including but not limited to autonomous vehicles, ADAS, UAVs, industrial automation, robotics, biometrics, modeling, augmented and virtual reality, 3D mapping, and/or security.

Figure 8:
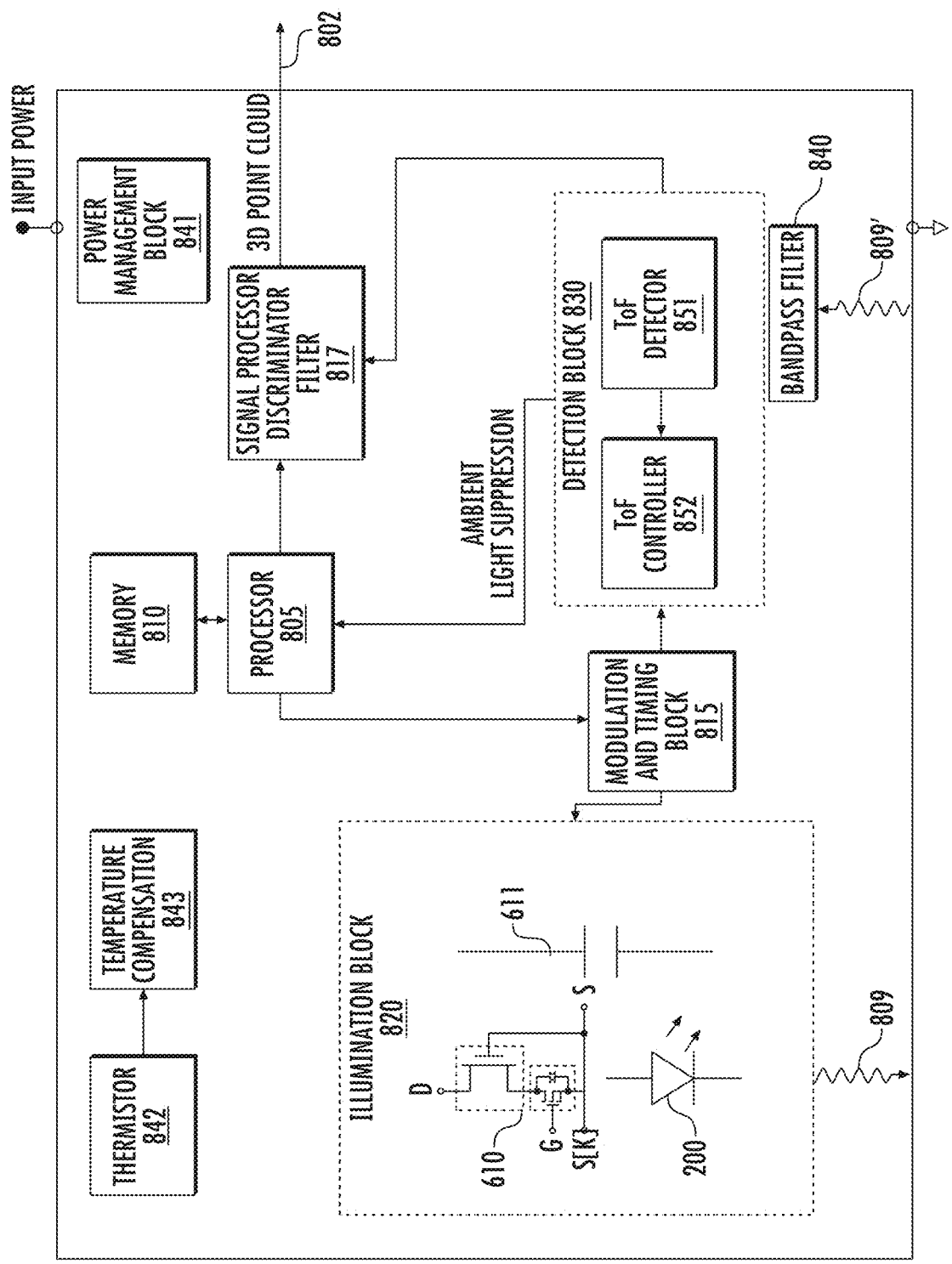
FIG. 8 is a block diagram illustrating an example system architecture for a LIDAR device in accordance with some embodiments described herein.

FIG. 8 is a block diagram illustrating an example system 800 for a LIDAR device, such as the LIDAR device 700a, 700b, 700c of FIGS. 7A-7C, in accordance with some embodiments described herein. As shown in FIG. 8, the system 800 integrates multiple electrically coupled integrated circuit elements to provide the LIDAR device functionality described herein. In particular, the system 800 includes a processor 805 that is coupled to a memory device 810, an illumination circuit 820, and a detection circuit 830. The memory device 810 stores computer readable program code therein, which, when executed by the processor, operates the illumination circuit 820 and the detection circuit 830 to collect, process, and output data, such as 3D point cloud data, indicative of one or more targets in the operating environment. The system 800 may further include a thermistor 842 and associated temperature compensation circuit 843, as well as a power management circuit 841 that is configured to regulate voltage or power to the system 800.

The illumination circuit 820 includes an array of surface-emitting laser diodes 200, driver transistor(s) 610, and associated circuit elements 611, electrically connected in any of various configurations. In some embodiments, the illumination circuit 820 may be a laser array including rows and/or columns of VCSELs 200, such as any of the VCSEL arrays 300a, 300b, 600 described herein. Operation of the illumination circuit 820 to emit light pulses 809 may be controlled by the processor 805 via a modulation and timing circuit 815 to generate a pulsed light output 809. Beam-shaping and/or focusing optics may also be included in or adjacent the array of laser diodes 200 to shape and/or direct the light pulses 809.

The detection circuit 830 may include a time-of-flight (ToF) detector 851 coupled to a ToF controller 852. The ToF detector 851 may include one or more optical detector devices, such as an array of pin, pinFET, linear avalanche photodiode (APD), silicon photomultiplier (SPM), and/or single photon avalanche diode (SPAD) devices. The ToF controller 852 may determine the distance to a target by measuring the round trip ("time-of-flight") of a laser pulse 809' reflected by the target and received at the ToF detector 851. In some embodiments, the reflected laser pulse 809' may be filtered by an optical filter 840, such as a bandpass filter, prior to detection by the ToF detector 851. The output of the detection block 830 may be processed to suppress ambient light, and then provided to the processor 805, which may perform further processing and/or filtering (via signal processor discriminator filter 817, and may provide the filtered output data (for example, 3D point cloud data) for data analysis. The data analysis may include frame filtering and/or image processing. In some embodiments, the data analysis may be performed by an external device, for example, an autonomous vehicle intelligence system.

FIG. 9 is a cross-sectional view illustrating an example laser diode array 900 including edge-emitting laser diodes 910 in accordance with further embodiments described herein. As shown in FIG. 9, a laser diode 910 includes an active region 905 (which may include one or more quantum wells) for generation and emission of coherent light 909. The active region 905 is provided between p-type and n-type layers 901 and 902, with contacts 912 and 911 thereon, respectively. A diffraction grating layer may be included to provide feedback for lasing. The optical cavity axis of the laser diode 910 is oriented perpendicular to the direction of current flow, defining an edge-emitting device, so that the radiation 909 emerges from the edge of the device 910 rather than from a top surface thereof. The devices 910 may be assembled on a non-native substrate 907, for example, by micro-transfer printing, electrostatic adhesion, or other mass transfer techniques. Respective mirror elements (illustrated as micro-steering mirrors 913) may also be assembled on the substrate 907 (for example, by micro-transfer printing, electrostatic adhesion, or other mass transfer techniques), and oriented relative to the optical cavity axis of a laser diode 910 that is to be provided adjacent thereto, such that the radiation 909 from the laser diode 910 is reflected and ultimately emitted in a direction perpendicular to the substrate 907.

The substrate 907 may be rigid in some embodiments, or may be flexible in other embodiments, and electrically conductive thin-film interconnects may be formed to electrically connect respective contacts of the laser diodes 910 in series and/or parallel configurations, at spacings similar to those described with reference to the arrays 300a, 300b, and/or 600 herein. Likewise, as described above with reference to the examples of FIGS. 6A-6C, the array 900 may include other types of devices and/or devices formed from different materials (e.g., power capacitors, FETs, micro-lens arrays, etc.) integrated with the laser diodes 910 on the substrate 907 at the spacings described herein.

Further embodiments described herein may arise from realization that selection of materials for semiconductor DBR layers may be limited due to lattice matching requirements, which may make it more difficult to achieve high contrast in DBR layers. Semiconductor DBR layers are typically grown epitaxially with lattice matched layers, where the lattice matching may aid in forming interfaces that are distinct and largely free of defects such as dangling bonds. For example, VCSELs emitting light in wavelengths from about 650 nm to about 980 nm are typically based on gallium arsenide (GaAs) active regions, with distributed Bragg reflector (DBR) layers typically formed from alternating GaAs and AlGaAs layers. The refractive index of AlGaAs varies strongly as the Al fraction is increased, reducing the number of layers that may be required to achieve an efficient DBR layer as compared to some other material systems. Also, the lattice constant of GaAs does not vary strongly as the composition is changed, permitting multiple lattice-matched epitaxial layers with different refractive indices to be grown on a GaAs substrate. However, for materials that provide shorter wavelength emission (e.g., about 350 to about 600 nm or less) and/or longer wavelength emission (e.g., about 1000 nm to about 1600 nm or more), it may be more difficult to form DBR layers using lattice-matched materials. For example, the lattice constants of gallium nitride (GaN) (which may provide shorter wavelength emission) and indium phosphide (InP) (which may provide longer wavelength emission) may vary significantly with the changes in the material composition that are typically used to achieve the alternating high and low refractive index layers of a DBR layer.

In particular instances, for very short wavelength VCSELs, there may be epitaxial possibilities in the GaN material system using AlN and GaN, which may provide sufficient refractive index contrast for DBR applications. However, these materials have large lattice mismatch and dissimilar coefficients of thermal expansion (CTEs), and thus may not be well suited to thick epitaxial growth. AlInN may be a potential candidate DBR material which may be grown lattice matched to GaN, but in practice, phase separation issues may make this alloy difficult to grow. Other candidate epitaxial DBR layers may be formed from $NbN_2$ or ScAlN. These materials may have etch selectivity to GaN. $NbN_2$ is not far from lattice matched to GaN, and ScAlN can be grown lattice matched, and may be used for the buried DBR in a VCSEL if formed with sufficient refractive index differences to GaN and sufficient transparency.

For longer wavelength VCSELs, material systems with emission in the 1550 nm range (such as InP) may be desirable due to telecommunications significance. One difficulty with this material system is the identification of lattice matched compounds to InP that provide sufficient refractive index contrast at 1550 nm, which is worse for wavelengths shorter than 1550 nm. One option is AlInGaAs/InP or AlInGaAs/InGaAsP, where the AlInGaAs bandgap is slightly wider than 1550 nm. However, to achieve high reflectivity, more than 40 periods may be required, which can be costly. Also, AlInGaAs may be a poor thermal conductor.

Some embodiments described herein may be directed to the use of heterogeneous and/or dielectric materials in forming DBRs. Some considerations for forming dielectric DBRs may include (but are not limited to) surface roughness compatibility with transfer printing; differences in CTE between the epitaxial active region and the dielectric, which may present reliability issues; and that thermal conductivity of the dielectric mirror layer may be poor for heatsinking the device. Some candidate materials for short wavelength VCSEL DBR layers may include $SiO_2/ZrO_2$, which may provide high index contrast and are transparent materials to UV wavelengths. Amorphous $ZrO_2$ may be fabricated using thermal evaporation or similar deposition techniques. Using $MgF_2$ may provide greater index contrast than using $SiO_2$, which may reduce the number of periods required (and thus cost). Some candidate materials for long wavelength VCSEL DBR layers may include GaAs/AlGaAs, (which are grown for shorter wavelength VCSELs, but can be transfer-printed or otherwise deposited on InP), due to the relatively low roughness and good thermal conductivity and close CTE match to InP. Dielectric DBR layers may provide several high index contrast options, for example, CaF/ZnS (where less than 10 layers may be used for front and rear VCSELs).

Figure 10A:
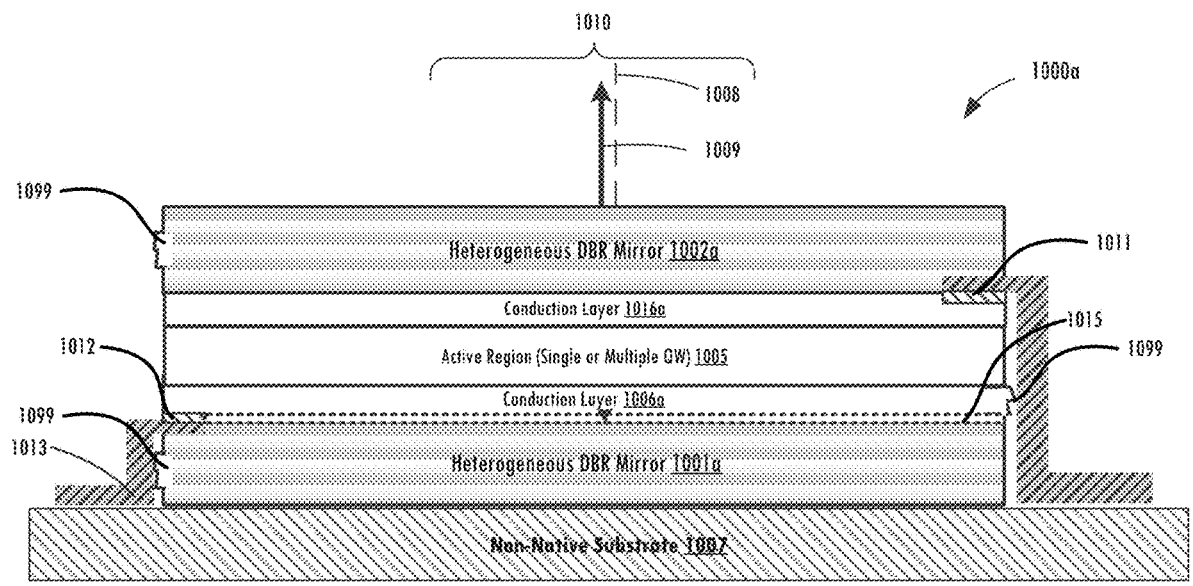
FIG. 10A is a cross-sectional view illustrating an example laser diode including an active region and at least one DBR layer formed of heterogeneous materials in accordance with some embodiments described herein.
Figure 10B:
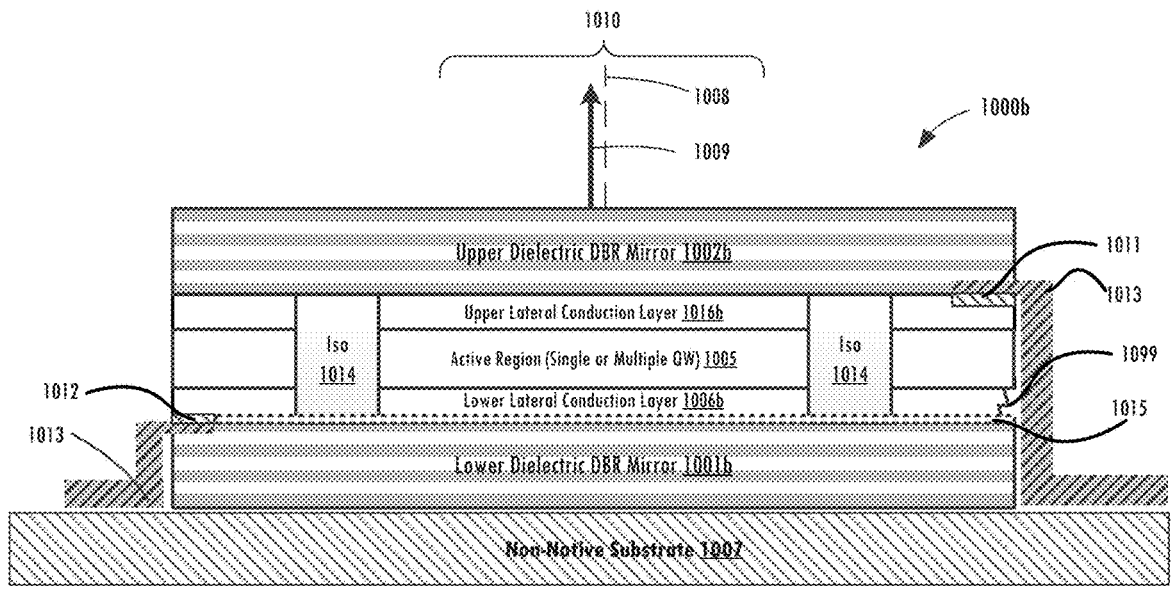
FIG. 10B is a cross-sectional view illustrating an example laser diode including at least one DBR layer formed of dielectric materials in accordance with some embodiments described herein.

Accordingly, further embodiments described herein are directed to laser diodes including active regions and DBR layers formed of heterogeneous materials. The laser diodes may include a highly reflective lower distributed Bragg reflector (DBR) layer and a less reflective upper DBR layer, with an active region including a semiconductor gain material located in a micro-cavity between the two DBR layers, where the optical thickness of the micro-cavity may be on the order of the emission wavelength. FIG. 10A is a cross-sectional view illustrating an example laser diode (shown as a VCSEL 1000a) including an active region and at least one DBR layer 1001a, 1002a formed of heterogeneous materials in accordance with some embodiments described herein, while FIG. 10B illustrates an example laser diode (shown as a VCSEL 1000b) where the DBR layer(s) include dielectric materials that define dielectric mirror layers 1001b, 1002b. The VCSELs 1000a, 1000b respectively include anode and cathode contacts 1011 and 1012 that are smaller than the lasing aperture 1010 in at least one dimension. A first electrically conductive film interconnect 1013 is provided on the first contact 1011, and a second electrically conductive film interconnect 1013 is provided on the second contact 1012 to provide electrical connections to the VCSELs 1000a, 1000b. The active region 1005 may include lower and upper lateral conduction layers 1006a, 1006b and 1016a, 1016b, which may be used to provide electrical contact to the active region 1005 of the VCSELs 1000a, 1000b in some embodiments.

As shown in FIGS. 10A and 10B, the VCSELs 1000a, 1000b respectively include an active region 1005 with one or more quantum well or quantum-dot layers that are separated by spacer or barrier layers for generation and emission of coherent light 1009. The optical cavity axis 1008 of the VCSELs 1000a, 1000b is oriented along the direction of current flow (rather than perpendicular to the current flow as in some conventional laser diodes), defining a vertical cavity with a length along the direction of current flow. This cavity length of the active region 1005 may be short compared with the lateral dimensions of the active region 1005, so that the radiation 1009 emerges from the surface of the cavity rather than from its edge.

The active region 1005 may be sandwiched between lower DBR layers 1001a, 1001b (more generally referred to as DBR layer 1001) and upper DBR layers 1002a, 1002b (more generally referred to as DBR layer 1002) where the active region 1005 and the DBR layers 1001 and 1002 are formed of heterogeneous materials. In some embodiments, one or both of the DBR layers 1001, 1002 may be formed of semiconductor layers that are of a different material system than the semiconductor material of the active region 1005. The lower DBR layer 1001a may be n-doped and the upper DBR layer 1002a may be p-doped, or vice versa. In further embodiments, one or both of the DBR layers 1001b, 1002b may be formed of dielectric layers, and the anode and cathode contacts 1011 and 1012 may be formed to contact upper and lower lateral conduction layers 1006b and 1016b, respectively, as shown in FIG. 10B (as the dielectric DBR layers 1001b, 1002b may be electrically insulating). Oxide or other isolation regions 1014 may also be provided to define isolated current apertures.

The VCSEL 1000a, 1000b may be formed of materials that are selected to provide light emission at or over a desired wavelength range. In some example embodiments, the VCSEL 1000a, 1000b may be an indium phosphide (InP)-based structure. In particular embodiments, the active region 1005 may include one or more InP-based layers (for example, a multi-quantum well (MQW) active region including alternating InGaAsP/InP or AlGaInAs/InP layers), which are configured to emit light having a wavelength of about 1400 nanometers to about 1600 nanometers. In further example embodiments, the VCSEL 1000a, 1000b may be gallium nitride (GaN)-based structure. In particular embodiments, the active region 1005 may include one or more GaN-based layers (for example, a MQW active region including alternating GaAlN/GaInN layers), which are configured to emit light having a wavelength of about 350 nanometers to about 450 nanometers.

In light of difficulties in lattice matching to the active region 1005 of longer wavelength (e.g., InP-based) or shorter wavelength (e.g., GaN-based) materials, embodiments described herein may utilize fabrication processes other than epitaxial growth to form the active regions 1005 on the lower DBR layers 1001a, 1001b with independent lattice structures (e.g., not based on the lattice structure of the underlying layer). That is, an interface between the lower DBR layers 1001a, 1001b and one or more overlying layers may be free of or may otherwise not include a seed layer for forming the active region 1005. As such, the materials of the active region 1005 and the lower DBR layers 1001a, 1001b may not be lattice matched. More generally, embodiments described herein remove lattice matching constraints in forming the active region 1005 on the upper or lower DBR layers 1001 or 1002 (depending on the VCSEL and substrate orientation), such that the materials of the DBR layers 1001 and/or 1002 may be selected to provide desired and/or optimal refractive index differences, where the respective lattice structures of the materials of the active region 1005 and either of the DBR layers 1001, 1002 are independent of one another.

In some embodiments, the active region 1005 may be formed (e.g., by epitaxial growth) from a source wafer, and then transferred from the source wafer to the one of the DBR layers 1001, 1002. For example, micro-transfer printing techniques may utilize a stamp to break anchor structures to release the active region 1005 from a source wafer, adhere the active region 1005 (along with multiple other active regions 1005) to a surface of the stamp, and simultaneously transfer the multiple active regions 1005 to respective lower DBR layers 1001a, 1001b that have been formed on a non-native target substrate 1007 (i.e., a substrate that is different from the source wafer on which the active region 1005 is formed) by contacting the surface of the stamp including the dies 400 thereon with respective surfaces of the lower DBR layers 1001a, 1001b, thereby defining a print interface 1015 therebetween. As the active region 1005 is not epitaxially grown on the DBR layers 1001a, 1001b, the print interface 1015 may be free of a seed layer for the active region 1005. In some embodiments, the print interface 1015 may include an adhesive layer that improves adhesion between the overlying conduction layer 1006a, 1006b and the underlying DBR layers 1001a, 1001b. The adhesive layer may be optically transparent to the wavelengths of light emission provided by the active region 1005, and/or can be refractive-index matched to provide desired optical performance. For example, the adhesive layer may have a thickness and/or other optical characteristics so as to effectively function as one of the refractive index layers of the DBR layer 1001a, 1001b in some embodiments.

Also, the active region 1005 (and/or associated conduction layers 1006, 1016) may include a broken tether portion or a corresponding relief feature 1099 at a periphery thereof. As mentioned above, the broken tether portion 1099 may be a broken or fractured portion of an anchor structure formed on the source wafer for the active region 1005, which may be broken by the stamping process and may protrude from or may be recessed at an edge or side surface of the active region 1005 after transfer onto the one of the DBR layers 1001, 1002 on the non-native substrate 1007. The broken tether portion or relief feature 1099 may include a portion of the material of the active region 1005, the lateral conduction layer(s) 1006, 1016, and/or the anchor structure (e.g., anchor structure 499 shown in FIG. 4D').

In the example of FIG. 10B, one or both of the dielectric DBR layers 1001b, 1002b may be formed from alternating high and low refractive index dielectric layers. The dielectric layers may include, but are not limited to, $TiO_2$, $SiO_2$, $TaO_5$, HfO, $Al_2O_3$, $Si_3N_4$, a-Si, etc. The dielectric layers can be evaporated, sputtered, or PECVD thin film deposited onto the surface of the non-native substrate 1007 to define the lower DBR 1001b, or onto the surface of the upper lateral conduction layer 1016b of the active region 1005 to define the upper DBR layer 1002b. That is, a fabrication process for forming the VCSEL 1000b may include thin-film deposition of the DBR layer 1001b on a non-native substrate 1007, micro-transfer printing the active region 1005 (including sublayers thereof and adhesive layers in some embodiments) on the DBR layer 1001b, and thin-film deposition of the DBR layer 1002b on the active region 1005. As an alternative, one or both of the dielectric DBR layers 1001b, 1002b may be transfer printed in a manner similar to that of the active region 1005. More particularly, in some embodiments, the VCSEL 1000a, 1000b may be formed by transfer printing the DBR layer 1001a, 1001b on a non-native substrate 1007, transfer printing the active region 1005 on the DBR layer 1001a, 1001b, and transfer printing the DBR layer 1002a, 1002b on the active region 1005. In such embodiments, the transfer-printed DBR layer(s) 1001 and/or 1002 may respectively include broken tether portions and/or relief features including portions of the material(s) of the DBR layer(s) 1001 and/or 1002 at a periphery thereof.

Figure 11:
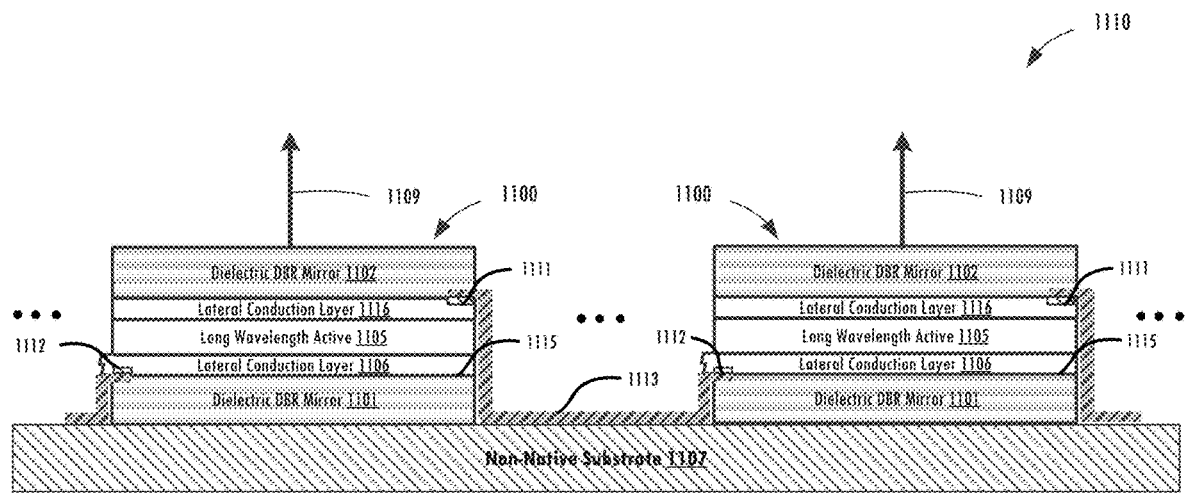
FIG. 11 is a cross-sectional view illustrating an example distributed emitter array including long wavelength laser diodes in accordance with some embodiments described herein.

FIG. 11 is a cross-sectional view illustrating an example distributed emitter array 1110 including laser diodes (illustrated as VCSELs 1100) in accordance with some embodiments described herein. The VCSELs 1100 of the array 1110 may be structured and/or fabricated similarly to the VCSELs 1000a or 1000b, that is, to include heterogeneous materials for the active region 1105 and the DBR layers 1101, 1102. In the example of FIG. 11, the VCSELs 1100 are implemented using long wavelength materials (e.g., which emit light over a wavelength range of about 1400 nm to about 1600 nm or more) for the active region 1105; however, other materials may be selected for the active regions 1105 to implement an array that provides light emission over other desired emission ranges.

For example, longer wavelength laser arrays, e.g., providing light emission in wavelength ranges between about 1300 nm to about 2000 nm, may be attractive for LIDAR applications, in light of greater eye safety (as laser wavelengths longer than 1400 nm may be more strongly absorbed in the cornea and lens, and are thus less likely to reach the retina) and higher signal-to-noise ratio (SNR) (because solar radiation (noise) is lower in the longer wavelength portions of the visible spectrum than in the near infrared (IR) portion of the visible spectrum). In some embodiments, longer wavelength light emission at about 1550 nm may be achieved using InP-based active regions. However, as the lattice constant of InP may vary significantly with changes in material composition as noted above, it may be difficult to form DBR layers using lattice matched materials for InP-based active regions.

As such, as shown in FIG. 11, a distributed emitter array 1110 including long wavelength VCSELs 1100 may be provided on a non-native substrate 1107. Each VCSEL 1100 may include heterogeneous DBR layers 1101, 1102 and active regions 1105. For example, dielectric DBR layers 1101 may be formed at respective locations on the non-native substrate 1107 using thin film deposition techniques (e.g., evaporation, sputtering, or plasma enhanced chemical vapor deposition). Respective active regions 1105 formed from long wavelength semiconductor materials (e.g., InP) may be assembled onto the dielectric DBR layers 1101, for example, by micro-transfer printing, electrostatic adhesion, or other mass transfer techniques. As such, an interface 1115 may be defined between the active regions 1105 (or sublayers thereof) and the dielectric DBR layers 1101, where the interface 1115 is free of a seed layer for material of the active regions 1105 and may include an adhesive layer that improves adhesion with the underlying DBR layers 1101. The active regions 1105 may include one or more lateral conduction sublayers 1106, 1116 on opposite surfaces thereof that are printed or otherwise transferred to the surface of the DBR layers 1101 along with the active regions 1105, for instance, as described above with reference to FIGS. 4F' and 4G'. One or more of the lateral conduction sublayers 1106, 1116 may include relief features at a periphery thereof, which may be similar to the relief features 599 shown in FIGS. 5D-5E. DBR layers 1102 may be similarly formed using thin-film deposition techniques on surfaces of the active regions 1105 or upper lateral conduction layers 1116. Alternatively, the DBR layers 1101 and/or 1102 may be assembled on the substrate 1107 and/or on the active regions 1105 using micro-transfer printing, electrostatic adhesion, or other mass transfer techniques, and may include respective broken tether portions or relief features as discussed above.

The VCSELs 1100 may be electrically connected in series (or anode-to-cathode) on the non-native substrate 1107 and/or may integrate devices and/or devices formed from different materials (e.g. power capacitors, FETs, etc.) in-between VCSELs 1100 at the sub-500 μm spacings described herein, for example, in a manner similar to the arrangements described above with reference to the distributed array 600 and driver transistors 610 of FIGS. 6A-6C. Also, the non-native substrate 1107 may be a flexible substrate, and may be bent or deformed to provide a desired curvature or profile, such as those shown and described above with reference to the substrate 307b of FIG. 3B. Likewise, the VCSELs 1100 and/or sublayers 1101, 1102, 1105 thereof may be fabricated using any of the techniques described above with reference to FIGS. 4A-4F and 4A'-4G'.

Figure 12A:
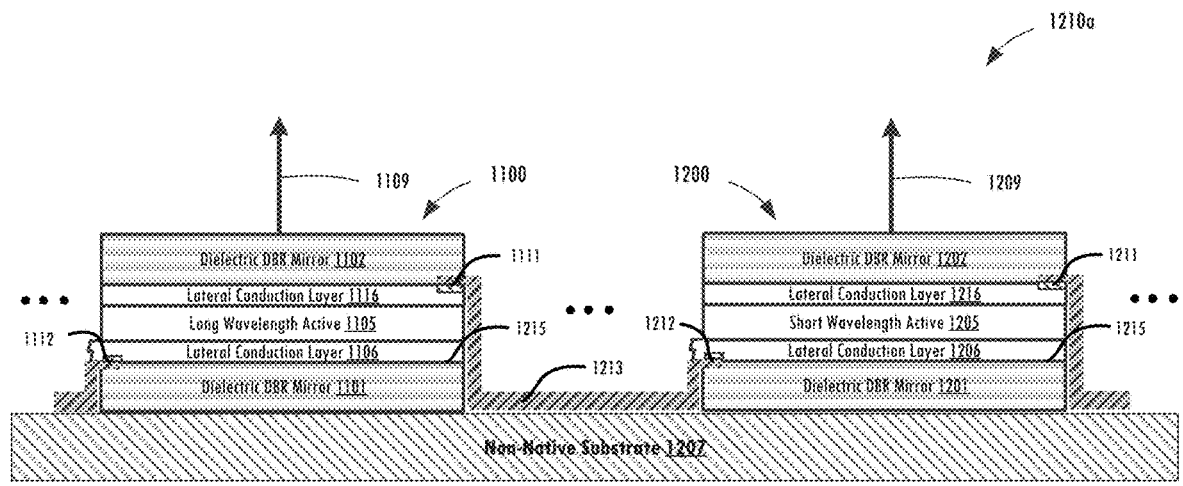
FIG. 12A is a cross-sectional view of illustrating an example distributed emitter array including laser diodes that emit light in different wavelength ranges in accordance with some embodiments described herein.
Figure 12B:
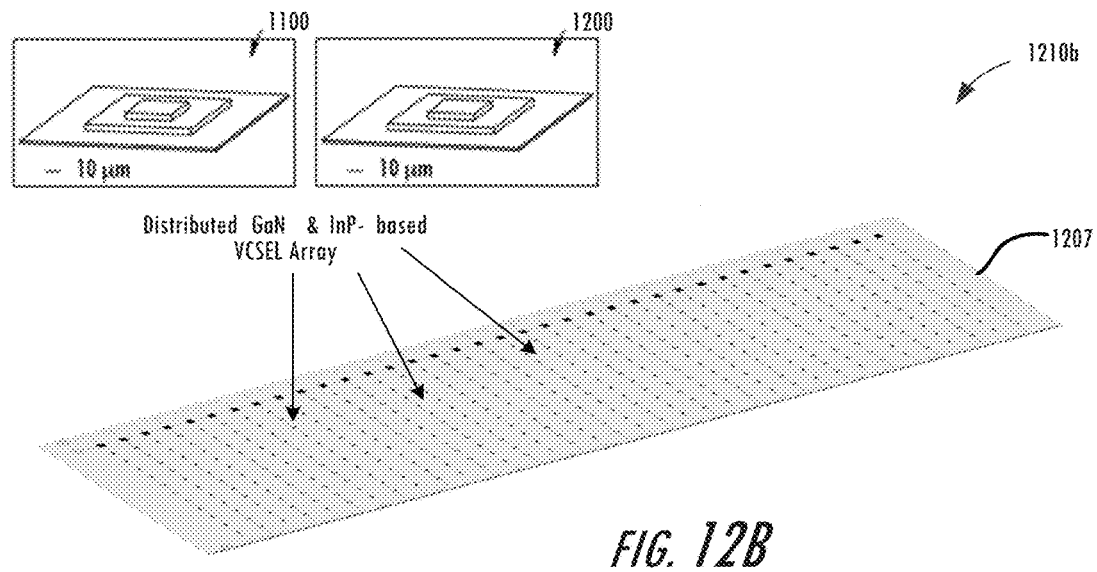
FIG. 12B is a perspective view illustrating an example emitter array including heterogeneously-interspersed laser diodes that emit light in different wavelength ranges in accordance with some embodiments described herein.
Figure 12C:
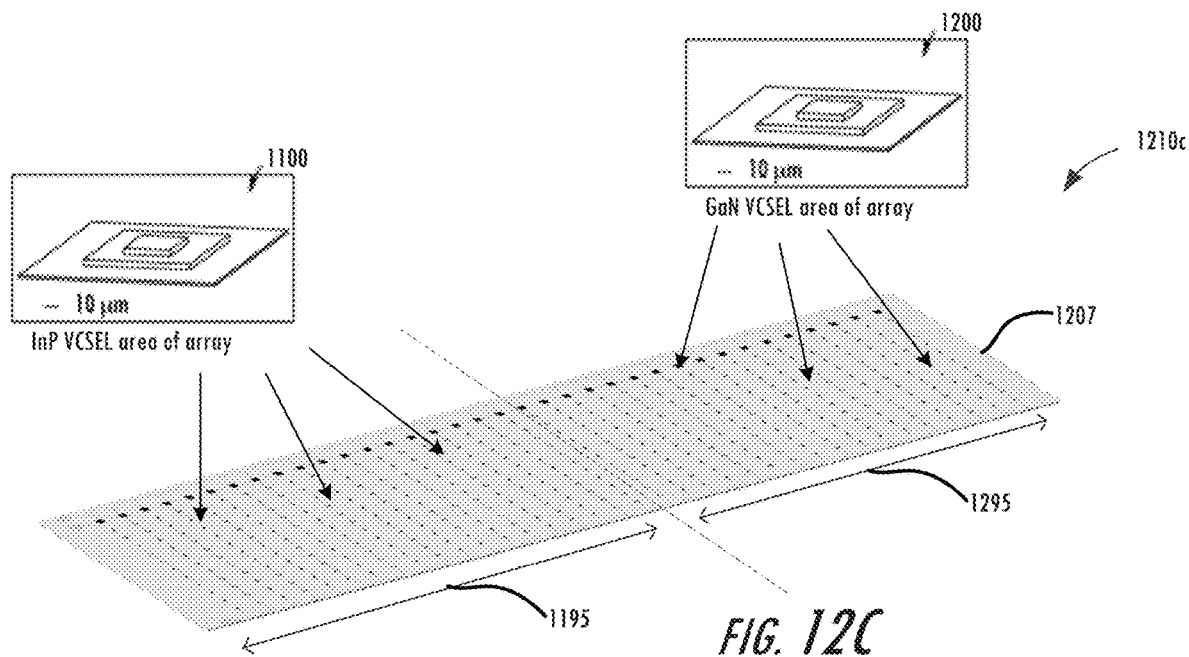
FIG. 12C is a perspective view illustrating an example emitter array including homogenous areas of laser diodes that emit light in respective wavelength ranges in accordance with some embodiments described herein.

FIGS. 12A-12C illustrate example distributed emitter arrays 1210a, 1210b, 1210c including laser diodes (illustrated as VCSELs 1100 and 1200) in accordance with some embodiments described herein. The VCSELs 1100, 1200 of the arrays 1210a, 1210b, 1210c may be structured and/or fabricated similarly to the VCSELs 1000a or 1000b, that is, to include heterogeneous materials for the active regions 1105, 1205 and the DBR layers 1101, 1201 and 1102, 1202. In the examples of FIGS. 12A-12C, the VCSELs 1100 are implemented using long wavelength materials (e.g., which emit light over a wavelength range of about 1400 nm to about 1600 nm or more) for the active region 1105 and the VCSELs 1200 are implemented using short wavelength materials (e.g., which emit light over a wavelength range of about 350 nm to about 450 nm, or less) for the active region 1205. That is, the arrays 1210a, 1210b, 1210c include multiple laser diodes 1100, 1200 that emit light in different wavelength ranges.

For example, in LIDAR applications, intensity data from multiple lasers having different emission wavelengths may allow for improved differentiation of materials, based for instance on differences in target reflectance for the different wavelengths. However, fabricating arrays including lasers of different emission wavelengths may involve challenges. For example, the physical length (and thus, the optical path length as a function of the physical length and the refractive index) of the optical cavity may be different for lasers of different emission wavelengths. Also, the thickness and/or compositions of the refractive index layers for the DBR layers may differ for the different materials that provide the different emission wavelengths (generally, the longer the emission wavelength, the thicker the layers in the DBR layer stack). As mentioned above, it may be difficult to form lattice matched DBR layers for the different wavelength material systems. As such, embodiments described herein provide active regions 1105 and 1205 and DBR layers 1101, 1102 and 1201, 1202 of heterogeneous materials, where the materials of the DBR layers 1201, 1202 are selected for the shorter wavelength active regions 1205 (e.g., GaN), while the materials of the DBR layers 1101, 1102 are selected for the longer wavelength active regions 1105 (e.g., InP).

In particular, as shown in FIG. 12A, a distributed emitter array 1210a including both long wavelength VCSELs 1100 and short wavelength VCSELs 1200 may be provided on a non-native substrate 1207. The VCSELs 1100 and 1200 may include heterogeneous DBR layers 1101, 1102 and 1201, 1202 and active regions 1105 and 1205, respectively. For example, dielectric DBR layers 1101 and 1201 may be formed at respective locations on the non-native substrate 1207 using thin film deposition techniques (e.g., evaporation, sputtering, or plasma enhanced chemical vapor deposition). Respective active regions 1105 formed from long wavelength semiconductor materials (e.g., InP) may be assembled onto the dielectric DBR layers 1101, while respective active regions 1205 formed from short wavelength semiconductor materials (e.g., GaN) may be assembled onto the dielectric DBR layers 1201.

As mentioned above, the active regions 1105 and/or 1205 may be assembled on the DBR layers 1101 and 1201, for example, by micro-transfer printing, electrostatic adhesion, or other mass transfer techniques. As such, interfaces 1115 may be defined between the active regions 1105 (or sublayers thereof) and the dielectric DBR layers 1101, and interfaces 1215 may be defined between the active regions 1205 (or sublayers thereof) and the dielectric DBR layers 1201. The interfaces 1115 and 1215 are free of a seed layer for material of the active regions 1105 and 1205, respectively, and may include respective adhesive layers in some embodiments. The active regions 1105 and 1205 may include one or more lateral conduction sublayers 1106, 1116 and 1206, 1216 on opposite surfaces thereof, which may be printed or otherwise transferred to the surface of the DBR layers 1101 and 1201 along with the active regions 1105 and 1205, respectively, as described above for example with reference to FIGS. 4F' and 4G'. One or more of the lateral conduction sublayers 1106, 1116 and 1206, 1216 may include relief features at a periphery thereof, which may be similar to the relief features 599 shown in FIGS. 5D-5E. DBR layers 1102 and 1202 may be similarly formed using thin-film deposition techniques on surfaces of the active regions 1105 or upper lateral conduction layers 1116. Alternatively, the DBR layers 1101, 1201 and/or 1102, 1202 may be assembled on the substrate 1207 and/or on the active regions 1105, 1205 using micro-transfer printing, electrostatic adhesion, or other mass transfer techniques, and may include broken tether portions or relief features as discussed above.

As such, as shown in the perspective view of FIG. 12B, laser diodes 1100 and 1200 that emit light in different wavelength ranges may be heterogeneously-interspersed in the same array 1210b. Additionally or alternatively, laser diodes 1100 and 1200 that emit light in different wavelength ranges may be assembled in respective sections or areas 1195 and 1295 of the same array 1210c, as shown in the perspective view of FIG. 12C. That is, multi-wavelength laser diode arrays 1210a, 1210b, 1210c in accordance with embodiments described herein may include multiple lasers of different wavelengths that are homogeneously arranged in respective sections and/or heterogeneously interspersed throughout one or more sections of an array substrate 1207. Also, in some embodiments, a concentration of the laser diodes 1100 and/or 1200 per area of the arrays 1210a, 1210b, 1210c may differ at different sections of the array, for example, as may benefit some LIDAR sensor applications that provide higher resolution (via a greater concentration of laser diodes 1100 and/or 1200) in a central portion of the array corresponding to a forward direction of travel, but lower resolution (via a lesser concentration of laser diodes 1100 and/or 1200) at peripheral regions of the array. Additionally or alternatively, the curvature of the substrate 1207 may be configured to provide a desired power distribution; for example, the substrate 1207 may define a cylindrical, acylindrical, spherical or aspherical curve whose normal surfaces provide a desired distribution of relative amounts of power. In some embodiments, the curvature of the substrate 1207 may be dynamically altered, in a manner similar as discussed above with reference to the substrate 307b of FIG. 3B.

The arrays 1110, 1210a, 1210b, 1210c illustrated by way of example in FIGS. 11 and 12A-12C may include hundreds or thousands of closely-spaced VCSELs 1100, 1200, some of which may be electrically connected in series or in parallel configurations. For example, multiple dies 1100, 1200, in accordance with some embodiments described herein may be assembled and electrically connected in series (or anode-to-cathode) within the footprint of the conventional VCSEL chip 10 of FIG. 2C. Electrically conductive thin-film interconnects 1113, 1213 may be formed to electrically connect respective contacts of the VCSELs 1100, 1200 in series and/or parallel configurations, and may be similar to the interconnects 213 described above. The conductive thin-film interconnects 1113, 1213 may be formed in a parallel process, before, after, or between fabrication of one or more sublayers of the laser diodes 1100, 1200 on the substrate 1107, 1207, for instance, by patterning an electrically conductive film using conventional photolithography techniques. The laser diodes 1100, 1200 may thus be free of electrical connections through the substrate 1107, 1207. Due to the small dimensions of the laser diodes 1100, 1200 and the connections provided by the conductive thin-film interconnects 1113, 1213, a spacing between two immediately adjacent laser diodes 1100, 1200 may be less than about 150 micrometers (μm), or in some embodiments, less than about 100 μm, or less than about 50 μm, with or without connections to a shared or common cathode/anode.

The VCSELs 1100, 1200 may further integrate devices and/or devices formed from different materials (e.g. power capacitors, FETs, etc.) in-between VCSELs 1100, 1200 at the sub-500 μm spacings described herein, for example, in a manner similar to the arrangements described above with reference to the distributed array 600 and driver transistors 610 of FIGS. 6A-6C. Likewise, the VCSELs 1100, 1200 and/or sublayers thereof may be fabricated using any of the techniques described above with reference to FIGS. 4A-4F and 4A'-4G'. More generally, the fabrication techniques, device integration, and/or non-native substrate characteristics described herein with reference to particular laser diode structures (and/or sublayers thereof) may be used to fabricate any of the laser diode structures, sublayers thereof, and/or laser arrays described herein.

As described herein, as the active regions 1005, 1105, 1205 of the laser diodes 1000a, 1000b, 1100, 1200 shown in FIGS. 10A-12C need not be subject to lattice matching constraints for epitaxial growth on the underlying DBR layers 1001, 1101, 1201 or 1002, 1102, 1202, and the materials of the active regions 1005, 1105, 1205 can therefore be selected to provide desired emission wavelengths. Likewise, the materials of the DBR layers 1001, 1101, 1201 or 1002, 1102, 1202 can be selected to provide desired refractive indices as suitable for the materials for the active regions 1005, 1105, 1205. Although described by way of example with reference to GaN-based and InP-based VCSELs, it will be understood that materials and/or material compositions of the active regions and/or DBR layers may be tuned and/or otherwise selected to provide light emission at desired wavelengths and/or as suited to different environmental or operating conditions.

Figure 13A:
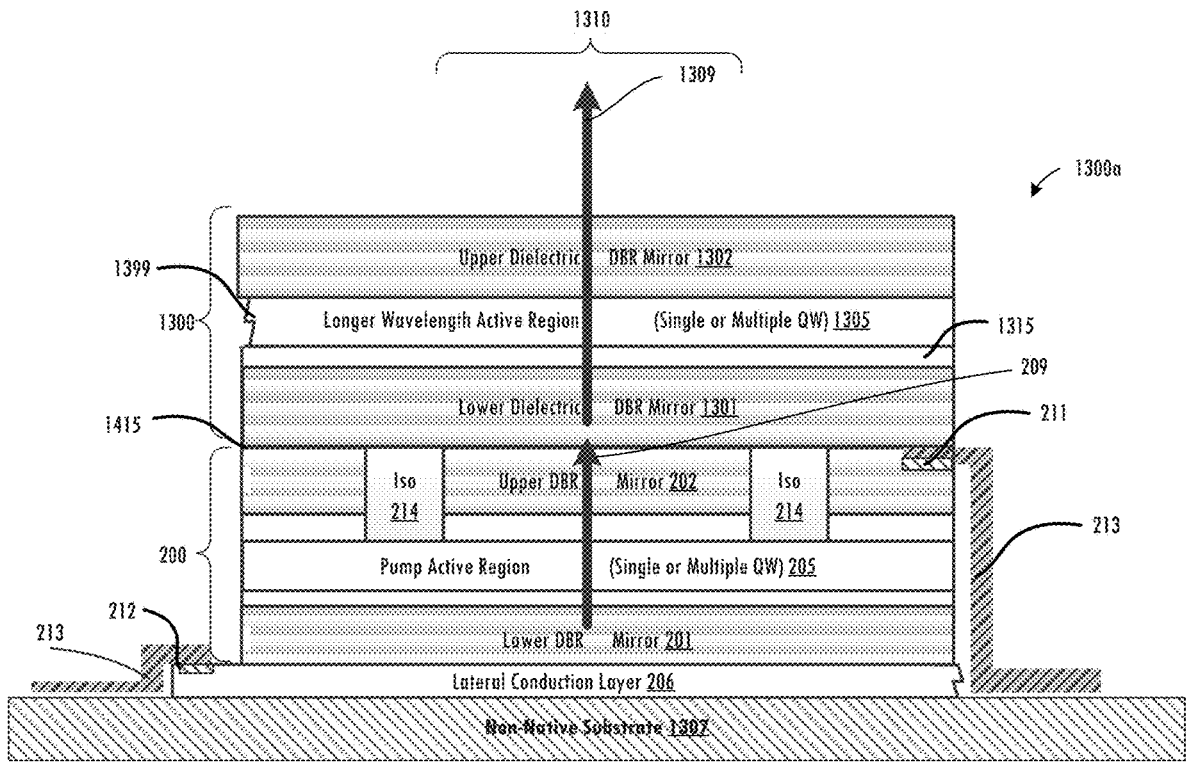
FIG. 13A is a cross-sectional view illustrating an example laser diode configuration including an optically-pumped active region in accordance with some embodiments described herein.

FIG. 13A is a cross-sectional view illustrating an example laser diode configuration 1300a including an optically-pumped active region in accordance with some embodiments described herein. As shown in FIG. 13A, the active region 1305 of a laser diode (illustrated as a VCSEL 1300) may be pumped by an external light source that emits light 209 of a shorter emission wavelength (illustrated as a VCSEL 200). The VCSEL 200 may be a monolithic structure including an active region 205 between lower and upper DBR mirror structures 201 and 202, a lateral conduction layer 206, and isolation regions 214 defining a lasing aperture 210. The VCSEL 200 may include anode and cathode contacts 211, 212 and electrical interconnections 213 as discussed above with reference to FIGS. 2A-2C, and thus further description of the VCSEL 200 (which serves as an optical pump in FIG. 13A and is also referred to as a pump laser 200) will be omitted.

As shown in the laser diode configuration 1300a of FIG. 13A, some embodiments described herein may use optical pumping by the light emission 209 of an underlying VCSEL 200 to obtain carrier inversion in a non-GaAs VCSEL 1300 (also referred to as an emitting laser 1300), which includes an active region 1305 of a material that is configured to emit light 1309 of a longer emission wavelength than the material of the active region 205 of the underlying VCSEL 200. Current can thus be confined to the pump laser 200, such that the emitting laser 1300 is free of anode and cathode contacts. The absence of contacts may be particularly advantageous for some material compositions (e.g., InGaAsP compositions), for which contact formation may be more difficult than for GaAs structures. As such, the VCSEL 1300 may include upper and lower DBR layers 1301 and 1302 formed of dielectric materials, avoiding complexities with forming contacts to the active region 1305 when positioned between the non-conducting dielectric DBR layers 1301, 1302. That is, the active region 1305 of the emitting laser 1300 may be free of electrical contacts, allowing for greater ease in manufacture.

The optically-pumped laser diode configuration 1300a may be fabricated using various techniques, including but not limited to micro-transfer printing, electrostatic adhesion, and/or other mass transfer techniques, to define an array including a plurality of the laser diodes 1300. For example, micro-transfer printing techniques as described above with reference to FIGS. 4A-4F and 4A'-4G' may be used to fabricate respective pump lasers 200 on a surface of the non-native substrate 1307, and electrical interconnections 213 may likewise be formed as discussed above.

After fabrication of the pump lasers 200, the lower dielectric DBR layer 1301 of the respective emitting lasers 1300 may be formed on the upper DBR layer 202 including the lasing aperture 210 of the respective pump lasers 200, for example, using thin-film deposition techniques as discussed above. The longer wavelength active region 1305 of the emitting lasers 1300 may be formed on the respective DBR layers 1301 using micro-transfer printing techniques. For example, a stamp may be used to break anchor structures to release the active regions 1305 from a source wafer, adhere the active regions 1305 to a surface of the stamp, and simultaneously transfer the multiple active regions 1305 to respective lower DBR layers 1301 by contacting the surface of the stamp including the active regions 1305 thereon with respective surfaces of the lower DBR layers 1301, defining print interfaces 1315 therebetween.

As the active region 1305 is not epitaxially grown on the lower DBR layers 1301, the respective print interfaces 1315 may be free of seed layers for the active region 1305. In some embodiments, the print interfaces 1315 may include an adhesive layer to improve adhesion to the underlying DBR layers 1301. Also, the respective transfer printed active regions 1305 (and/or associated conduction layers printed along with the active regions 1305) may include a broken tether portion or a corresponding relief feature 1399 at a periphery thereof. The upper dielectric DBR layers 1302 of the respective emitting lasers 1300 may be formed on the respective active regions 1305, for example, using thin-film deposition techniques as discussed above. Alternatively, the DBR layers 1301 and/or 1302 may be assembled on the DBR layers 202 of the pump laser 200 and/or on the active regions 1305 using micro-transfer printing, electrostatic adhesion, or other mass transfer techniques, and may include respective broken tether portions or relief features as discussed above. The upper dielectric DBR layers 1302 define the respective lasing apertures of the emitting lasers 1300.

Although described in FIG. 13A with reference to a VCSEL-based pump laser 200, it will be understood that embodiments described herein are not limited to VCSELs, and the pump laser 200 may include other surface-emitting laser diodes that are configured to emit light 209 along an optical axis that is oriented perpendicular to a substrate or other surface on which the device 200 is provided. It will also be understood that, while described in FIG. 13A with reference to surface-emitting laser structures, laser diodes and laser diode arrays as described herein are not so limited, and may include edge-emitting laser structures (such as the edge-emitting laser diodes 910 of FIG. 9) that are configured to emit light along an optical axis that is oriented parallel to a substrate or other surface on which the device is provided as well, as shown in the examples of FIGS. 13B and 13C.

Figure 13B:
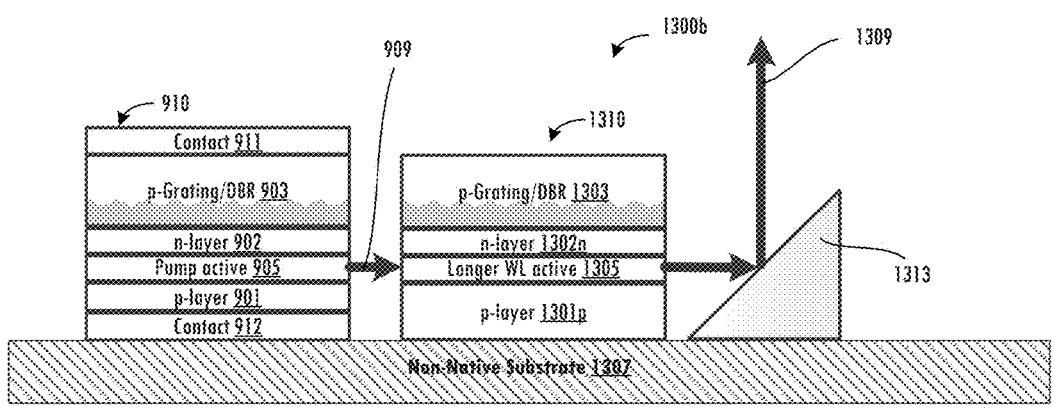
FIG. 13B is a cross-sectional view illustrating an example laser diode configuration including an optically-pumped active region in accordance with further embodiments described herein.
Figure 13C:
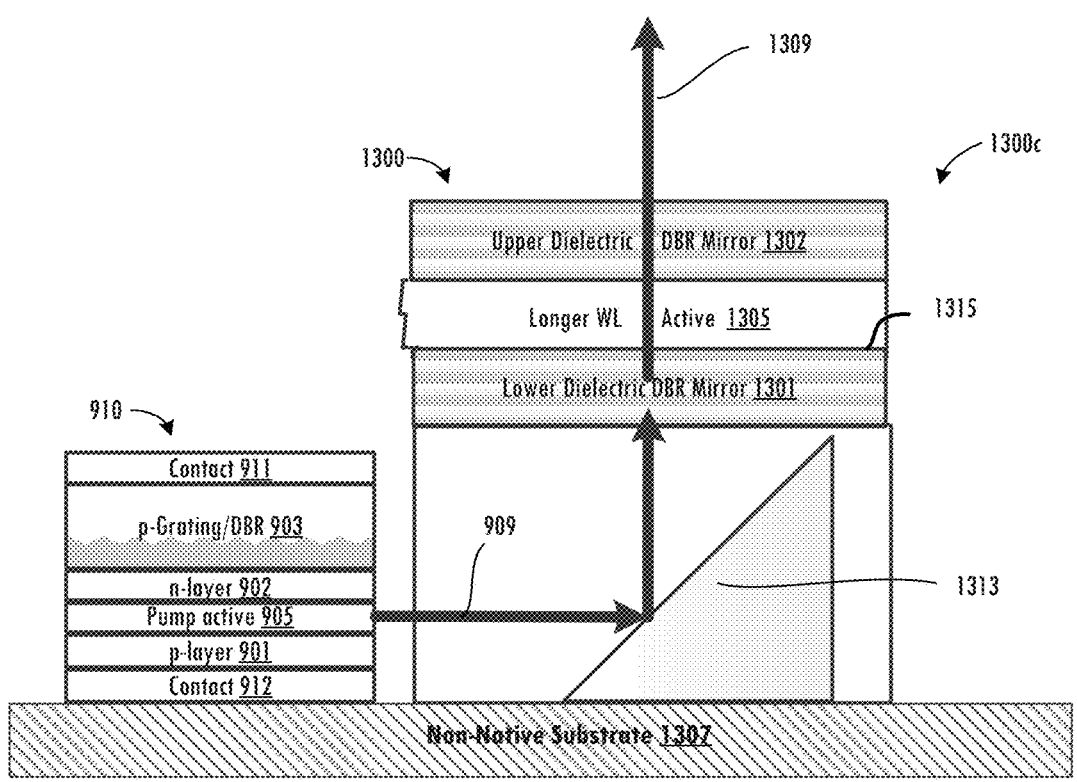
FIG. 13C is a cross-sectional view illustrating an example laser diode configuration including an optically-pumped active region in accordance with still further embodiments described herein.

FIG. 13B is a cross-sectional view illustrating an example laser diode configuration 1300b including an optically-pumped active region in accordance with further embodiments described herein. As shown in FIG. 13B, the laser diode configuration 1300b is functionally similar to the configuration 1300a of FIG. 13A, but includes an edge-emitting laser diode 910 as the pump laser, and an edge-emitting laser diode 1310 as the emitting laser on the non-native substrate 1307. As such, optical pumping by the light emission 909 of the pump laser 910 is similarly used to obtain carrier inversion in the emitting laser 1310, which includes an active region 1305 of a material that is configured to emit light 1309 of a longer emission wavelength than the material of the active region 905 of adjacent pump laser 910. Current can thus be confined to the pump laser 910, such that the emitting laser 1310 is free of anode and cathode contacts. A mirror structure 1313 is assembled on the substrate 1307 and oriented relative to the optical cavity axis of the emitting laser 1310 such that the radiation 1309 therefrom is reflected and ultimately emitted in a direction perpendicular to the substrate 1307. The devices 910, 1310, and/or 1313 may be assembled on a non-native substrate 1307, for example, by micro-transfer printing, electrostatic adhesion, or other mass transfer techniques.

In FIG. 13B, the pump laser 910 includes an active region 905 (which may include one or more quantum wells) for generation and emission of coherent light 909. The active region 905 is provided between p-type and n-type layers 901 and 902, with contacts 912 and 911 thereon, respectively. A diffraction grating layer 903 may provide feedback for lasing. The optical cavity axis of the laser diode 910 is oriented such that the radiation 909 emerges from the edge of the pump laser 910 and is directed toward the active region 1305 of the emitting laser 1310, which is arranged adjacent to the pump laser 910 on the substrate 1307.

The emitting laser 1310 likewise includes an active region 1305 (which may include one or more quantum wells) for generation and emission of coherent light 1309. The active region 1305 is provided between p-type and n-type layers 1301p and 1302n, but is free of anode and cathode contacts. A diffraction grating layer 1303 (which may be fabricated as a DBR layer in some embodiments) may provide feedback for lasing. The optical cavity axis of the laser diode 1310 is oriented such that the radiation 1309 emerges from the edge of the emitting laser 1310 and is directed toward the mirror structure 1313, for reflection and emission in a direction perpendicular to the substrate 1307.

FIG. 13C is a cross-sectional view illustrating an example laser diode configuration 1300c including an optically-pumped active region in accordance with still further embodiments described herein. As shown in FIG. 13C, the laser diode configuration 1300c is functionally similar to the configuration 1300a of FIGS. 13A and 13B, but includes the edge-emitting laser diode 910 as the pump laser, and a surface emitting laser diode (illustrated as a VCSEL 1300) as the emitting laser on the non-native substrate 1307, with a mirror structure 1313 assembled on the substrate 1307 and oriented relative to the optical cavity axis of the pump laser 910 such that the radiation 909 therefrom is reflected toward the emitting laser 1300. Optical pumping by the light emission 909 of the pump laser 910 is thus used to obtain carrier inversion in the emitting laser 1300, which includes an active region 1305 of a material that is configured to emit light 1309 of a longer emission wavelength than the material of the active region 905 of adjacent pump laser 910. Current can thus be confined to the pump laser 910, such that the emitting laser 1300 is free of anode and cathode contacts. The devices 910, 1300, and/or 1313 may be assembled on a non-native substrate 1307, for example, by micro-transfer printing, electrostatic adhesion, or other mass transfer techniques.

In FIGS. 13A-13C, the non-native substrate 1307 may be rigid in some embodiments, or may be flexible in other embodiments, and electrically conductive thin-film interconnects may be formed to electrically connect respective contacts of the laser diodes shown in the configurations 1300a, 1300b, 1300c in series and/or parallel configurations, at spacings and curvatures similar to those described with reference to any of the arrays described herein, such as the arrays 300a, 300b, 600, and/or 900. Likewise, as described above with reference to the examples of FIGS. 6A-6C, arrays including the laser diode configurations 1300a, 1300b, 1300c may also include other types of devices and/or devices formed from different materials (e.g., power capacitors, FETs, micro-lens arrays, etc.) integrated therewith on the non-native substrate 1307.

The present invention has been described above with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element is referred to as being "on," "connected," or "coupled" to another element, it can be directly on, connected, or coupled to the other element, or intervening elements may be present. In contrast, when an element is referred to as being "directly on," "directly connected," or "directly coupled" to another element, there are no intervening elements present. An "interface" between layers as used herein may or may not have direct contact between the layers.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments of the present invention described herein, and of the manner and process of making and using them, and shall support claims to any such combination or subcombination.

Although the invention has been described herein with reference to various embodiments, it will be appreciated that further variations and modifications may be made within the scope and spirit of the principles of the invention. Although specific terms are employed, they are used in a generic and descriptive sense only and not for purposes of limitation, the scope of embodiments of the present invention being set forth in the following claims.

The invention claimed is:

1. A laser diode element, comprising:
a first laser diode comprising a first lower Bragg reflector layer, a first active region, and a first upper Bragg reflector layer, the first upper Bragg reflector layer comprising a lasing aperture having an optical axis oriented perpendicular to a surface of the first active region,
wherein the first active region comprises a first material, wherein the first lower Bragg reflector layer comprises a second material, wherein respective lattice structures of the first and second materials are independent of one another, and wherein the first laser diode is free of electrical contacts thereto; and
a second laser diode comprising a second active region of a third material that is configured to emit light comprising a shorter emission wavelength than that of the first material, wherein the second laser diode comprises the second active region between second upper and lower Bragg reflector layers that comprise the third material, and wherein respective lattice structures of the third material, the second material, and the first material are independent of one another and wherein the second laser diode is arranged to optically pump the first active region of the first laser diode with the light comprising the shorter emission wavelength.

2. The laser diode element of claim 1, wherein an optical axis of a lasing aperture of the second laser diode is oriented parallel to a surface of the second active region, and further comprising:
a mirror structure arranged relative to the lasing aperture of the second laser diode to reflect the light comprising the shorter emission wavelength toward the first active region of the first laser diode.

3. The laser diode element of claim 1, wherein an optical axis of a lasing aperture of the second laser diode is oriented perpendicular to a surface of the second active region.

4. The laser diode element of claim 1, wherein an interface between the first lower Bragg reflector layer and the first active region is free of a seed layer for the first material.

5. A method of fabricating a Light Detection and Ranging (LIDAR) array, the method comprising:
providing a plurality of laser diodes on a non-native substrate, wherein the plurality of laser diodes comprises:
a first laser diode comprising a first lower Bragg reflector layer, a first active region, and a first upper Bragg reflector layer, the first upper Bragg reflector layer comprising a lasing aperture having an optical axis oriented perpendicular to a surface of the first active region,
wherein the first active region comprises a first material, wherein the first lower Bragg reflector layer comprises a second material, and wherein respective lattice structures of the first and second materials are independent of one another; and
a second laser diode comprising a second active region of a third material between second upper and lower Bragg reflector layers, and wherein respective lattice structures of the third material and a material of the second lower Bragg reflector layer are independent of one another, wherein the third material is configured to emit light comprising a wavelength of about 350 nanometers to about 450 nanometers.

6. The method of claim 5, wherein the second material is a dielectric material, and wherein providing the laser diodes on the non-native substrate comprises, for the first laser diode:
forming the first lower Bragg reflector layer on the non-native substrate using a thin film deposition process;
providing the first active region on a surface of the first lower Bragg reflector layer, wherein an interface therebetween is free of a seed layer for the first material; and
forming the first upper Bragg reflector layer on the surface of the first active region using a thin film deposition process.

7. The method of claim 5, wherein the respective lattice structures of the first and second materials are lattice mismatched.

8. The method of claim 5, wherein the first material is different than the third material.

9. A Light Detection and Ranging (LIDAR) array, comprising:
a plurality of laser diodes arranged on a non-native substrate, wherein the plurality of laser diodes comprises:
a first laser diode comprising a first lower Bragg reflector layer, a first active region, and a first upper Bragg reflector layer, the first upper Bragg reflector layer comprising a lasing aperture thereon having an optical axis oriented perpendicular to a surface of the first active region, wherein the first active region comprises a first material, wherein the first lower Bragg reflector layer comprises a second material, and wherein respective lattice structures of the first and second materials are independent of one another; and
a second laser diode comprising a second active region of a third material between second upper and lower Bragg reflector layers, and wherein respective lattice structures of the third material and a material of the second lower Bragg reflector layer are independent of one another, wherein the third material is configured to emit light comprising a wavelength of about 350 nanometers to about 450 nanometers.

10. The LIDAR array of claim 9, wherein the respective lattice structures of the first and second materials are lattice mismatched.

11. The LIDAR array of claim 9, wherein the second material is a dielectric material.

12. The LIDAR array of claim 9, wherein the first upper Bragg reflector layer comprises a dielectric material and has a lower reflectivity than the first lower Bragg reflector layer.

13. The LIDAR array of claim 9, wherein an interface between the first lower Bragg reflector layer and the first active region is free of a seed layer for the first material.

14. The LIDAR array of claim 9, wherein an interface between the first lower Bragg reflector layer and the first active region comprises an adhesive layer.

15. The LIDAR array of claim 9, wherein at least one of the first lower Bragg reflector layer, the first active region, or the first upper Bragg reflector layer comprises a micro-transfer-printed layer having a residual tether portion and/or a relief feature at a periphery thereof.

16. The LIDAR array of claim 15, wherein at least one of the residual tether portion or the relief feature comprises the first material.

17. The LIDAR array of claim 9, wherein the first material is configured to emit light comprising a wavelength of about 1400 nanometers to about 1600 nanometers.

18. The LIDAR array of claim 9, wherein a spacing between the first laser diode and an immediately adjacent laser diode of the plurality of laser diodes is less than about 150 micrometers, less than about 100 micrometers, or less than about 50 micrometers, and greater than about 10 micrometers.

19. The LIDAR array of claim 9, wherein the first material is different than the third material.

20. The LIDAR array of claim 19, wherein the first and second laser diodes are interspersed in the array among the plurality of laser diodes, or
wherein the array comprises a first area comprising a plurality of the first laser diodes and free of the second laser diodes, and a second area comprising a plurality of the second laser diodes and free of the first laser diodes.

* * * * *